US011978773B2

(12) United States Patent
Su et al.

(10) Patent No.: US 11,978,773 B2
(45) Date of Patent: May 7, 2024

(54) FORMATION METHOD OF SEMICONDUCTOR DEVICE STRUCTURE WITH SEMICONDUCTOR NANOSTRUCTURES

(71) Applicant: Taiwan Semiconductor Manufacturing Company, Ltd., Hsinchu (TW)

(72) Inventors: Huan-Chieh Su, Tianzhong Township, Changhua County (TW); Chun-Yuan Chen, HsinChu (TW); Li-Zhen Yu, New Taipei (TW); Shih-Chuan Chiu, Hsinchu (TW); Cheng-Chi Chuang, New Taipei (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 374 days.

(21) Appl. No.: 17/212,108

(22) Filed: Mar. 25, 2021

(65) Prior Publication Data

US 2022/0310804 A1 Sep. 29, 2022

(51) Int. Cl.
*H01L 29/417* (2006.01)
*H01L 21/8234* (2006.01)
(Continued)

(52) U.S. Cl.
CPC .................. *H01L 29/41733* (2013.01); *H01L 21/823418* (2013.01); *H01L 21/823475* (2013.01);
(Continued)

(58) Field of Classification Search
CPC ....... H01L 29/41733; H01L 21/823418; H01L 21/823475; H01L 27/088; H01L 29/0665;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Matthew E. Gordon
(74) *Attorney, Agent, or Firm* — Birch, Stewart, Kolasch & Birch, LLP

(57) ABSTRACT

A semiconductor device structure and a method for forming a semiconductor device structure are provided. The semiconductor device structure includes a stack of channel structures over a base structure. The semiconductor device structure also includes a first epitaxial structure and a second epitaxial structure sandwiching the channel structures. The semiconductor device structure further includes a gate stack wrapped around each of the channel structures and a backside conductive contact connected to the second epitaxial structure. A first portion of the backside conductive contact is directly below the base structure, and a second portion of the backside conductive contact extends upwards to approach a bottom surface of the second epitaxial structure. In addition, the semiconductor device structure includes an insulating spacer between a sidewall of the base structure and the backside conductive contact.

20 Claims, 22 Drawing Sheets

(51) Int. Cl.

| | |
|---|---|
| ***H01L 27/088*** | (2006.01) |
| ***H01L 29/06*** | (2006.01) |
| ***H01L 29/423*** | (2006.01) |
| ***H01L 29/66*** | (2006.01) |
| ***H01L 29/786*** | (2006.01) |

(52) U.S. Cl.
CPC ........ *H01L 27/088* (2013.01); *H01L 29/0665* (2013.01); *H01L 29/41775* (2013.01); *H01L 29/42392* (2013.01); *H01L 29/66742* (2013.01); *H01L 29/78618* (2013.01)

(58) Field of Classification Search
CPC ......... H01L 29/41775; H01L 29/42392; H01L 29/66742; H01L 29/78618; H01L 21/82347; G09G 3/035
USPC .......................................................... 257/288
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2006/0205161 A1* | 9/2006 | Das | H01L 29/66462 257/E29.127 |
| 2020/0006478 A1* | 1/2020 | Hsu | H01L 29/42392 |
| 2020/0126987 A1* | 4/2020 | Rubin | H01L 29/0847 |
| 2020/0227305 A1* | 7/2020 | Cheng | H01L 29/66545 |
| 2020/0343342 A1* | 10/2020 | Xie | H01L 29/16 |
| 2020/0365687 A1* | 11/2020 | Xie | H01L 27/0886 |

* cited by examiner 142
142
128'
126'
106A
105d
105c
144
105b
136
105a
138d
101A
100
138s
137a
308
128'
126'
139
140
104d'
137b
104c'
138d
104b'
136
104a'
304

142
142
116
128'
126'
106A
105d
102d
105c
102c
136
105b
102b
105a
138d
101A
100
138s
137a
308
128'
126'
139
140
104d
137b
104c
138d
104b
136
104a
304

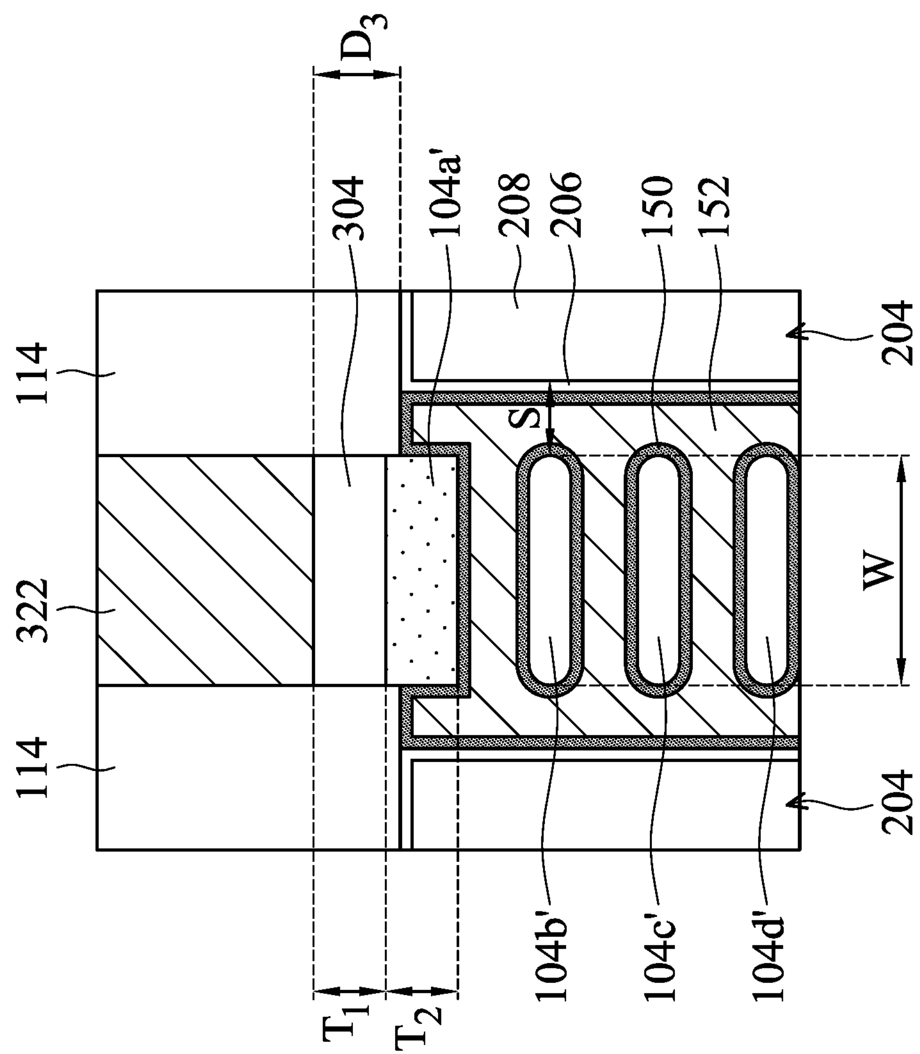
FIG. 3S"

FORMATION METHOD OF SEMICONDUCTOR DEVICE STRUCTURE WITH SEMICONDUCTOR NANOSTRUCTURES

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3S" is a cross-sectional view of a semiconductor device structure, in accordance with some embodiments.

DETAILED DESCRIPTION

Figure 1A:
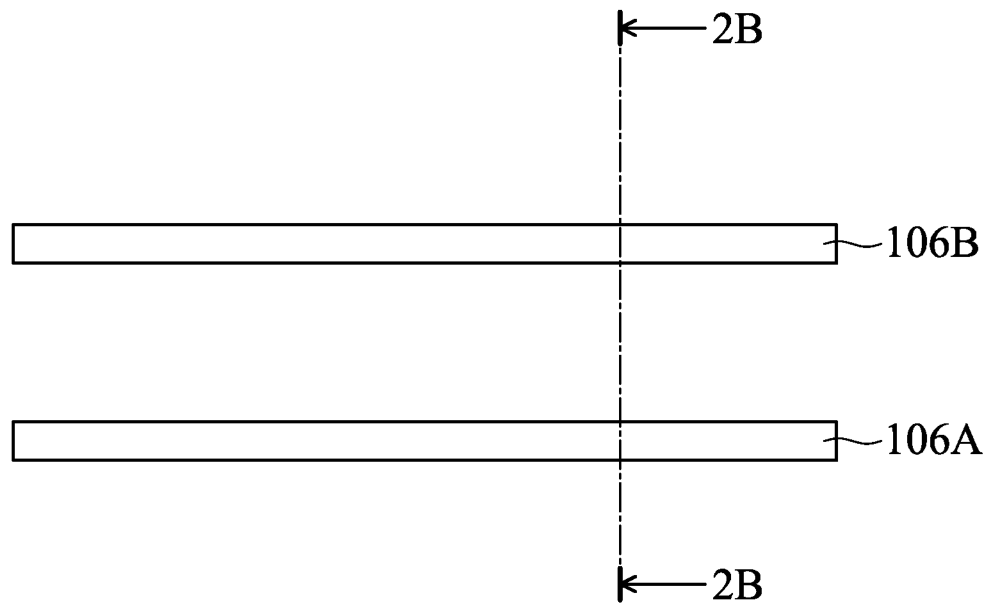
FIGS. 1A-1B are top views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10° in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% in some embodiments. The term "about" in relation to a numerical value x may mean x±5 or 10% in some embodiments.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
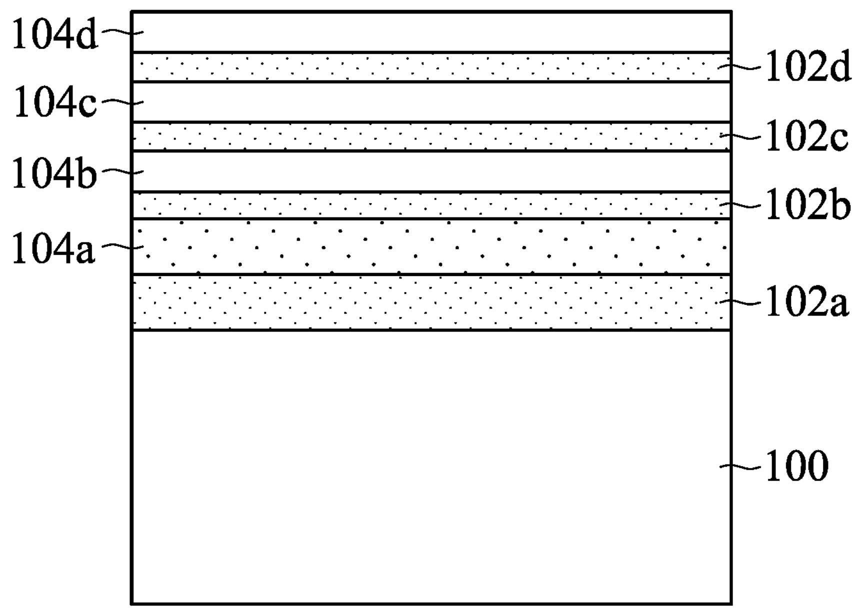
FIGS. 2A-2I are cross-sectional views of various stages of a process for forming a semiconductor device structure, in accordance with some embodiments.

FIGS. 2A-2I are cross-sectional views of various stages of a process for forming a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102*a*, 102*b*, 102*c*, and 102*d*, and the semiconductor stack also includes multiple semiconductor layers 104*a*, 104*b*, 104*c*, and 104*d*. In some embodiments, the semiconductor layers 102*a*-102*d* and the semiconductor layers 104*a*-104*d* are laid out alternately, as shown in FIG. 2A. In some embodiments, the semiconductor layer 102*a* is thicker than the semiconductor layer 102*b*, 102*c*, or 102*d*. In some embodiments, the semiconductor layer 104*a* is thicker than the semiconductor layer 104*b*, 104*c*, or 104*d*.

In the present disclosure, the side where the semiconductor stack is located is referred to as the frontside. The side opposite to the frontside with respect to the semiconductor substrate 100 is referred to as the backside.

In some embodiments, the semiconductor layers 102*b*-102*d* function as first sacrificial layers that will be removed in a subsequent process to release the semiconductor layers 104*b*-104*d*. The semiconductor layers 104*b*-104*d* that are released may function as channel structures of one or more transistors. In some embodiments, the semiconductor layer 102*a* is used as a second sacrificial layer and will be replaced with a dielectric material in a subsequent process.

In some embodiments, the semiconductor layer 104*a* functions as a base layer. The base layer may be formed into base structures and be used to physically separate a subsequently formed metal gate and a subsequently formed backside conductive contact from each other by a greater distance. Therefore, short circuiting between the subsequently formed metal gate and the subsequently formed backside conductive contact is prevented.

In some embodiments, the semiconductor layers 104*b*-104*d* that will be used to form channel structures are made of a material that is different than that of the semiconductor layers 104*a* and 102*a*-102*d*. In some embodiments, the semiconductor layers 104*b*-104*d* are made of or include silicon. In some embodiments, the first sacrificial layers (102*b*-102*c*), the second sacrificial layer (102*a*), and the base layer (104*a*) include silicon germanium with different atomic concentrations of germanium to achieve different etching selectivity and/or different oxidation rates during subsequent processing.

In some embodiments, the semiconductor layer 102*a* has a different atomic concentration of germanium than that of the semiconductor layer 102*b*, 102*c*, or 102*d*. In some embodiments, the semiconductor layer 102*a* has a greater atomic concentration of germanium than that of the semiconductor layer 102*b*, 102*c*, or 102*d*. The atomic concentration of germanium of the semiconductor layer 102*a* may be in a range from about 46% to about 65%. The atomic concentration of germanium of the semiconductor layer 102*b*, 102*c*, or 102*d* may be in a range from about 21% to about 45%.

In some embodiments, the semiconductor layer 104*a* has a different atomic concentration of germanium than that of the semiconductor layer 102*b*, 102*c*, 102*d*, or 102*a*. In some embodiments, the semiconductor layer 104*a* has a lower atomic concentration of germanium than that of the semiconductor layer 102*b*, 102*c*, or 102*d*. The atomic concentration of germanium of the semiconductor layer 102*a* may be in a range from about 5% to about 20%.

In some embodiments, the semiconductor layer 104*a* has a different atomic concentration of germanium than that of the semiconductor layer 104*b*, 104*c*, or 104*d*. In some embodiments, the semiconductor layer 104*a* has a greater atomic concentration of germanium than that of the semiconductor layer 104*b*, 104*c*, or 104*d*. In some embodiments, the semiconductor layer 104*b*, 104*c*, and 104*d* are substantially free of germanium.

The present disclosure contemplates that the semiconductor layers 102*b*-102*d*, the semiconductor layers 104*b*-104*d*, the semiconductor layer 102*a*, and the semiconductor layer 104*a* include any combination of semiconductor materials that can provide desired etching selectivity, desired oxidation rate differences, and/or desired performance characteristics (e.g., materials that maximize current flow).

In some embodiments, the semiconductor layers 102*a*-102*d* and 104*a*-104*d* are formed using multiple epitaxial growth operations. Each of the semiconductor layers 102*a*-102*d* and 104*a*-104*d* may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the semiconductor layers 102*a*-102*d* and 104*a*-104*d* are grown in-situ in the same process chamber. In some embodiments, the growth of the semiconductor layers 102*a*-102*d* and 104*a*-104*d* are alternately and sequentially performed in the same process chamber to complete the formation of the semiconductor stack. In some embodiments, the vacuum of the process chamber is not broken before the epitaxial growth of the semiconductor stack is accomplished.

Figure 2B:
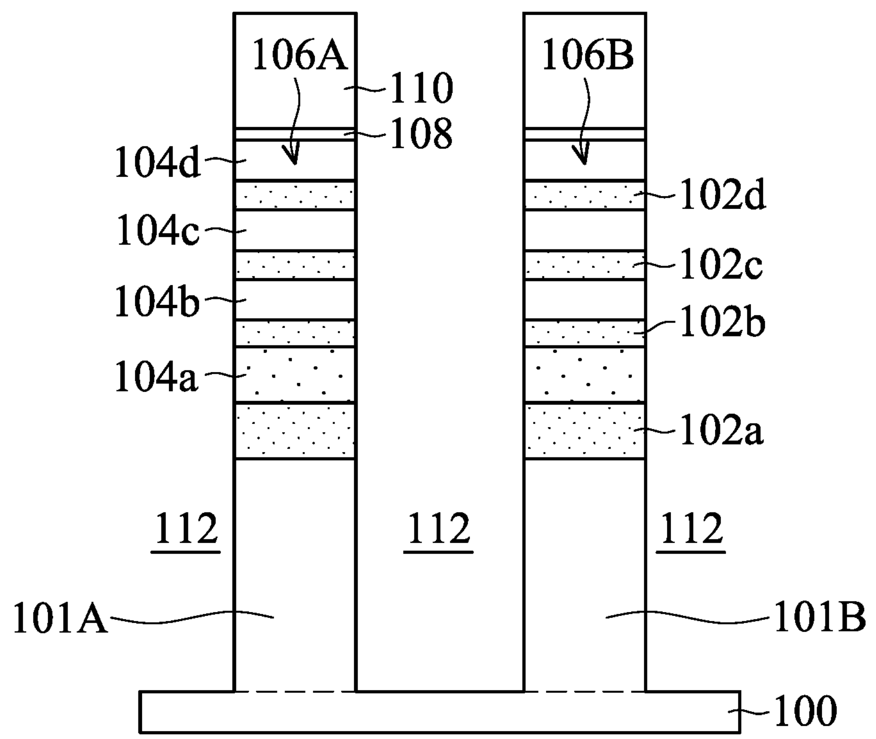

Afterwards, hard mask elements are formed over the semiconductor stack to assist in a subsequent patterning of the semiconductor stack. One or more photolithography processes and one or more etching processes are used to pattern the semiconductor stack into fin structures 106A and 106B, as shown in FIG. 2B in accordance with some embodiments. The fin structures 106A and 106B may be patterned by any suitable method. For example, the fin structures 106A and 106B may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

The semiconductor stack is partially removed to form trenches 112, as shown in FIG. 2B. Each of the fin structures 106A and 106B may include portions of the semiconductor layers 102*a*-102*d* and 104*a*-104*d* and semiconductor fins 101A and 101B. The semiconductor substrate 100 may also be partially removed during the etching process that forms the fin structures 106A and 106B. Protruding portions of the semiconductor substrate 100 that remain form the semiconductor fins 101A and 101B.

Each of the hard mask elements may include a first mask layer 108 and a second mask layer 110. The first mask layer 108 and the second mask layer 110 may be made of different materials. In some embodiments, the first mask layer 108 is made of a material that has good adhesion to the semiconductor layer 104*d*. The first mask layer 108 may be made of silicon oxide, germanium oxide, silicon germanium oxide, one or more other suitable materials, or a combination thereof. In some embodiments, the second mask layer 110 is made of a material that has good etching selectivity to the semiconductor layers 102*a*-102*d* and 104*a*-104*d*. The second layer 110 may be made of silicon nitride, silicon oxynitride, silicon carbide, one or more other suitable materials, or a combination thereof.

Figure 1B:
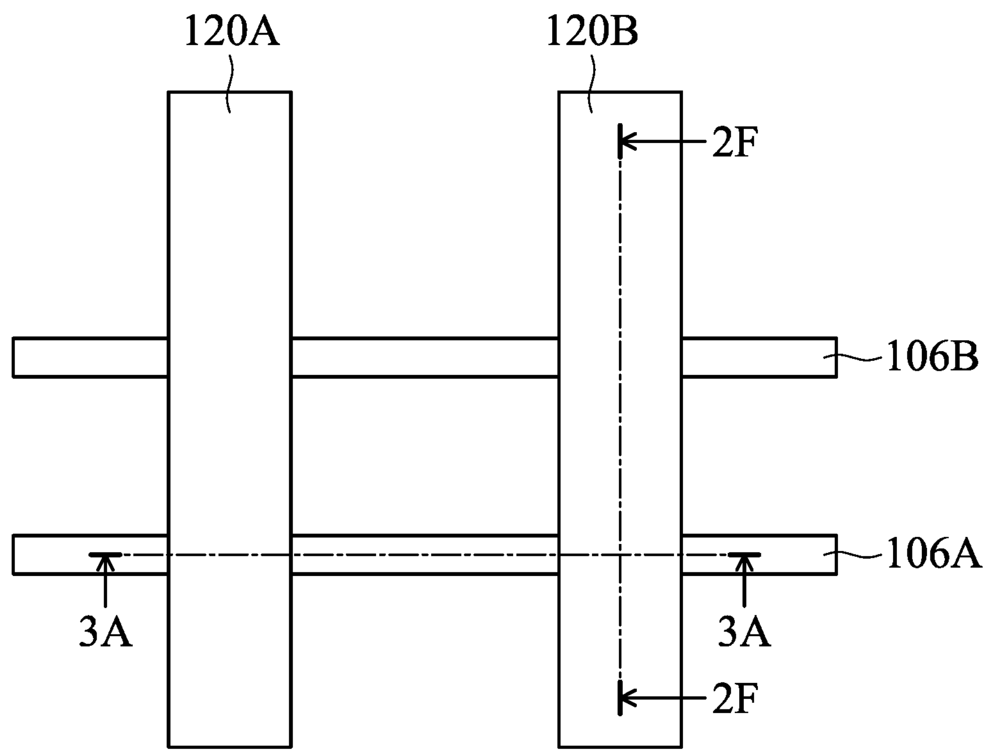

FIGS. 1A-1B are top views of various stages of a process for forming a semiconductor device structure, in accordance with some embodiments. In some embodiments, the fin structures 106A and 106B are oriented lengthwise. In some embodiments, the extending directions of the fin structures 106A and 106B are substantially parallel to each other, as shown in FIG. 1A. In some embodiments, FIG. 2B is a cross-sectional view of the structure taken along the line 2B-2B in FIG. 1A.

Figure 2C:
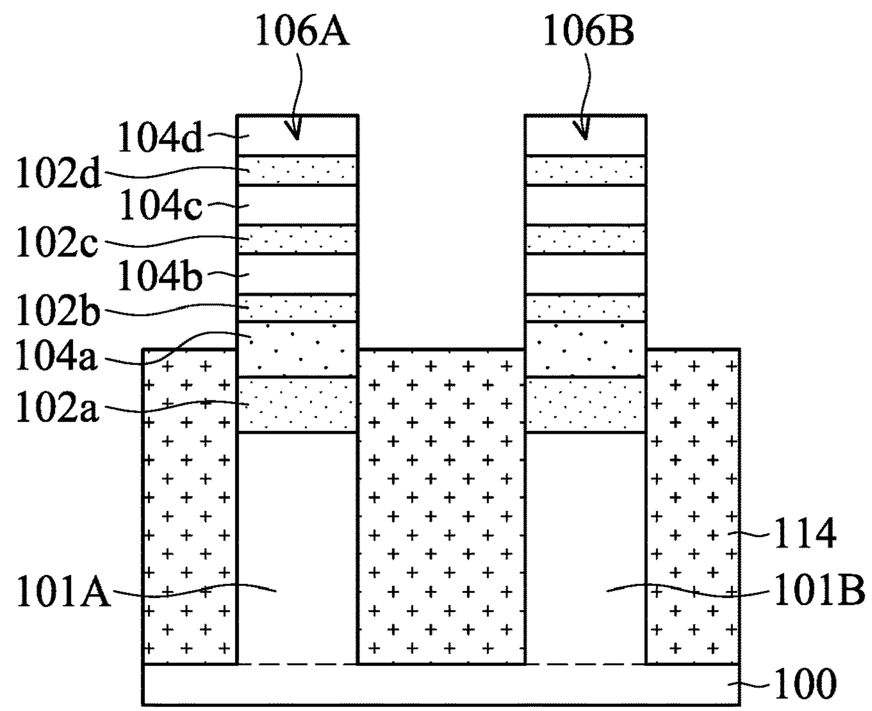

As shown in FIG. 2C, an isolation structure 114 is formed to surround lower portions of the fin structures 106A and 106B, in accordance with some embodiments. In some embodiments, one or more dielectric layers are deposited over the fin structures 106A and 106B and the semiconductor substrate 100 to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The dielectric layers may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof. Afterwards, one or more etching back processes are used to partially remove the dielectric layers. As a result, the remaining portion of the dielectric layers forms the isolation structure 114. Upper portions of the fin structures 106A and 106B protrude from the top surface of the isolation structure 114, as shown in FIG. 2C.

In some embodiments, the etching back process for forming the isolation structure 114 is carefully controlled to ensure that the topmost surface of the isolation structure 114 is positioned at a suitable height level, as shown in FIG. 2C. In some embodiments, the topmost surface of the isolation structure 114 is below the topmost surface of the semiconductor layer 104*a* (that functions as a base layer) and above the bottommost surface of the semiconductor layer 104*a*.

Afterwards, the hard mask elements (including the first mask layer 108 and the second mask layer 110) are removed. Alternatively, in some other embodiments, the hard mask elements are removed or consumed during the planarization process and/or the etching back process that forms the isolation structure 114.

Figure 2D:
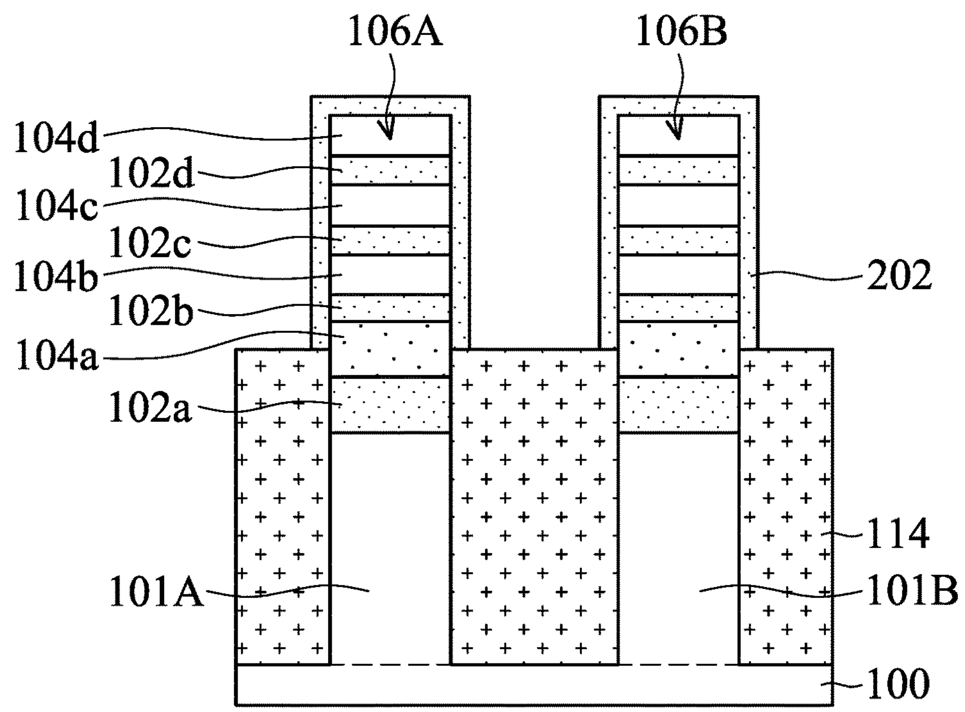

As shown in FIG. 2D, sacrificial spacers 202 are formed on the fin structures 106A and 106B, in accordance with some embodiments. In some embodiments, the sacrificial spacers 202 are selectively formed only on the semiconductor materials. In some embodiments, the sacrificial spacers 202 are epitaxially grown on the exposed surfaces of the fin structures 106A and 106B. The material and formation method of the sacrificial spacers 202 may be the same as or similar to those of the sacrificial layers 102*b*-102*d*. A suitable epitaxial growth time is used to form the sacrificial spacers 202 to ensure that each of the sacrificial spacers 202 is formed to have a suitable thickness.

Figure 2E:
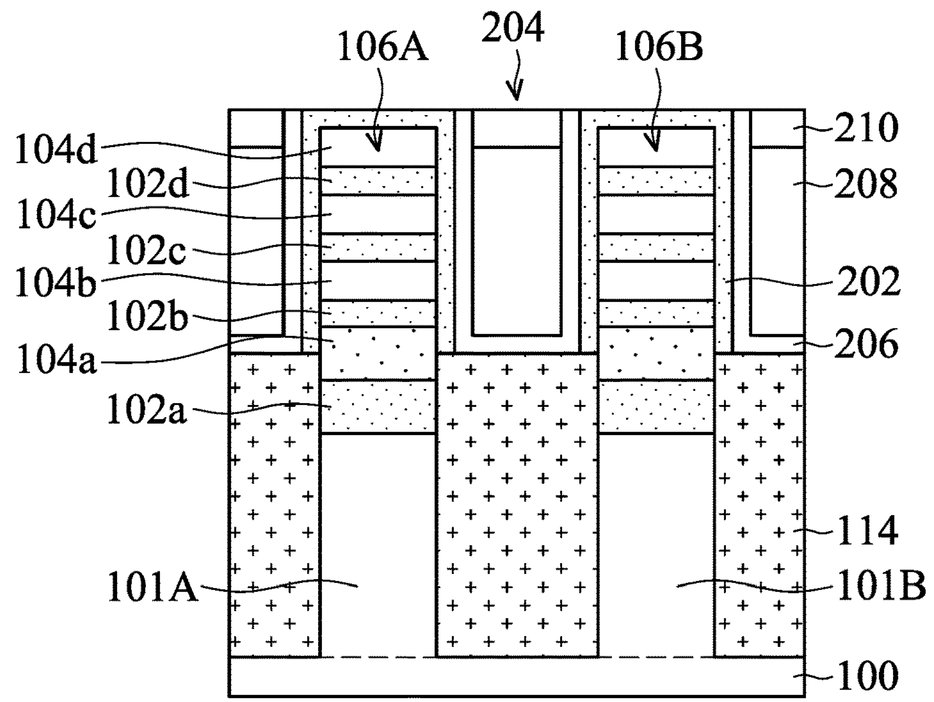

Afterwards, dielectric layers 206 and 208 are sequentially deposited over the structure shown in FIG. 2D, in accordance with some embodiments. Then, a planarization process is used to partially remove the dielectric layers 206 and 208. As a result, dielectric fins 204 are formed beside the fin structures 106A and 106B, as shown in FIG. 2E in accordance with some embodiments. The dielectric fins 204 may function as blocking structures that prevent the nearby epitaxial structures (that will be subsequently formed) over nearby fin structures from being merged together. In some embodiments, after the planarization process, the top surfaces of the sacrificial spacers 202 and the dielectric layers 206 and 208 are substantially level with each other. The planarization process may include a CMP process, a grinding process, a dry polishing process, an etching process, one or more other applicable processes, or a combination thereof.

The dielectric layer 206 may be made of or include silicon nitride, silicon oxynitride, carbon-containing silicon nitride, carbon-containing silicon oxynitride, one or more other suitable materials, or a combination thereof. The dielectric layer 206 may be deposited using a CVD process, an ALD process, one or more other applicable processes, or a combination thereof. The dielectric layer 208 may be made of or include silicon oxide, silicon carbide, silicon oxycarbide, silicon nitride, silicon oxynitride, carbon-containing silicon nitride, carbon-containing silicon oxynitride, one or more other suitable materials, or a combination thereof. The dielectric layer 208 may be deposited using an FCVD process, a CVD process, an ALD process, one or more other suitable materials, or a combination thereof.

Afterwards, the dielectric layer 208 is partially removed, in accordance with some embodiments. After the removal of the upper portions of the dielectric layer 208, multiple recesses are formed. Then, protection structures 210 are formed in the recesses, as shown in FIG. 2E in accordance with some embodiments.

In some embodiments, a protection layer is deposited to overfill the recesses. Afterwards, a planarization process is used to remove the portion of the protection layer outside of the recesses. As a result, the remaining portions of the protection layer in the recesses form the protection structures 210. The planarization process may include a CMP process, a grinding process, a dry polishing process, an etching process, one or more other applicable processes, or a combination thereof.

In some embodiments, the protection layer used for forming the protection structures 210 has a dielectric constant that is different than that of the dielectric layer 206. In some embodiments, the protection layer used for forming the protection structures 210 has a greater dielectric constant than that of the dielectric layer 206. The protection structures 210 may have a dielectric constant that is greater than about 7. The protection layer used for forming the protection structures 210 may be made of or include hafnium oxide, zirconium oxide, aluminum hafnium oxide, aluminum oxide, hafnium silicon oxide, one or more other suitable materials, or a combination thereof. The protection layer used for forming the protection structures 210 may be deposited using a CVD process, an ALD process, one or more other applicable processes, or a combination thereof.

However, embodiments of the disclosure are not limited thereto. Many variations and/or modifications can be made to embodiments of the disclosure. In some other embodiments, the protection layer used for forming the protection structures 210 has a lower dielectric constant than that of the dielectric layer 206.

Many variations and/or modifications can be made to embodiments of the disclosure. In some other embodiments, the protection structures 210 are not formed.

Figure 2F:
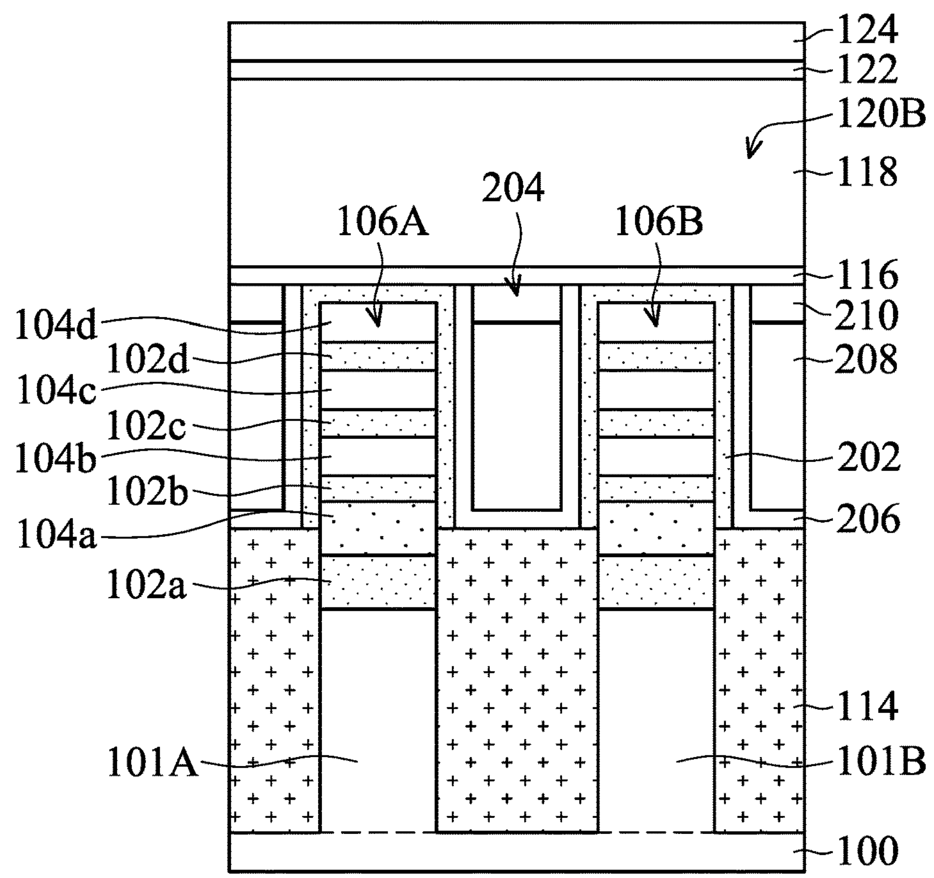
Figure 3A:
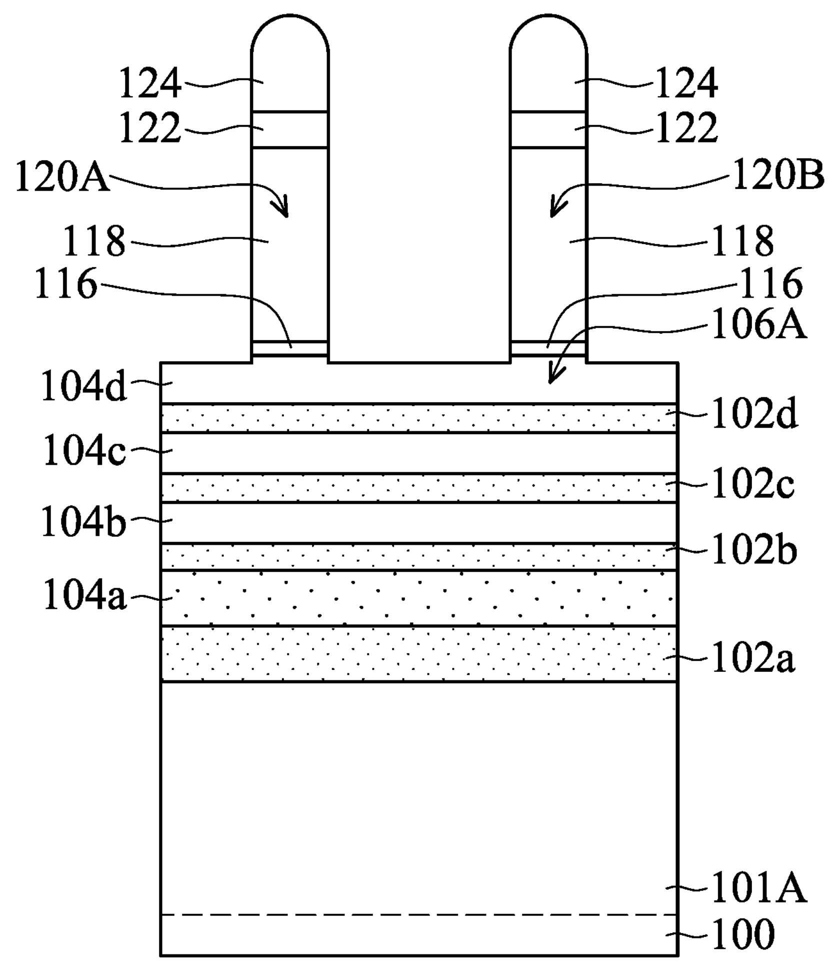
FIGS. 3A-3S are cross-sectional views of various stages of a process for forming a semiconductor device structure, in accordance with some embodiments.

Afterwards, dummy gate stacks 120A and 120B are formed to extend across the fin structures 106A and 106B, as shown in FIG. 1B in accordance with some embodiments. In some embodiments, FIG. 2F is a cross-sectional view of the structure taken along the line 2F-2F in FIG. 1B. FIGS. 3A-3S are cross-sectional views of various stages of a process for forming a semiconductor device structure, in accordance with some embodiments. In some embodiments, FIG. 3A is a cross-sectional view of the structure taken along the line 3A-3A in FIG. 1B.

As shown in FIGS. 1B, 2F, and 3A, the dummy gate stacks 120A and 120B are formed to partially cover and to extend across the fin structures 106A and 106B, in accordance with some embodiments. In some embodiments, the dummy gate stacks 120A and 120B wraps around the fin structures 106A and 106B. As shown in FIG. 2F, the dummy gate stack 120B extends across the fin structures 106A and 106B and the dielectric fins 204.

As shown in FIGS. 2F and 3A, each of the dummy gate stacks 120A and 120B includes a dummy gate dielectric layer 116 and a dummy gate electrode 118. The dummy gate dielectric layer 116 may be made of or include silicon oxide. The dummy gate electrodes 118 may be made of or include polysilicon.

In some embodiments, a dummy gate dielectric material layer and a dummy gate electrode layer are sequentially deposited over the isolation structure 114, the fin structures 106A and 106B, and the dielectric fins 204. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120A and 120B.

In some embodiments, hard mask elements including mask layers 122 and 124 are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks 120A and 120B that include the dummy gate dielectric layer 116 and the dummy gate electrodes 118.

Figure 3B:
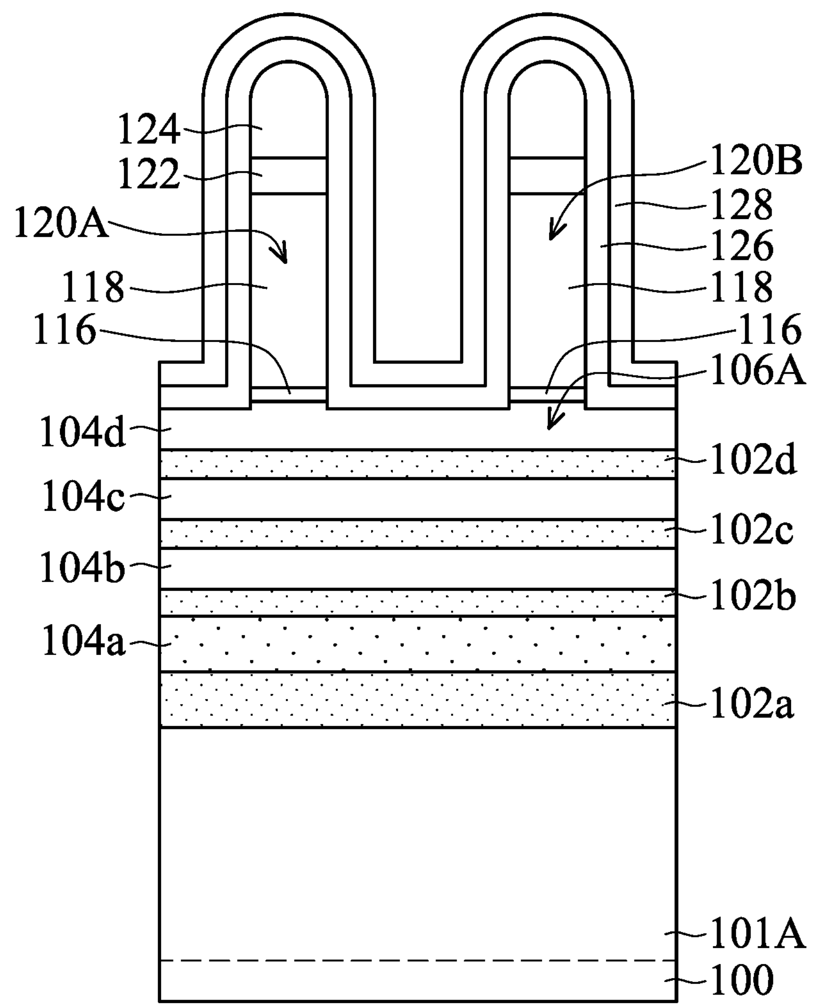
FIGS. 3C', 3D', 3F', 3G', 3H', 3R' and 3S' are perspective views of various stages of a process for forming a semiconductor device structure, in accordance with some embodiments.

As shown in FIG. 3B, spacer layers 126 and 128 are afterwards deposited over the structure shown in FIG. 3A, in accordance with some embodiments. The spacer layers 126 and 128 extend along the sidewalls of the dummy gate stacks 120A and 120B. The spacer layers 126 and 128 are made of different materials. The spacer layer 126 may be made of a dielectric material that has a low dielectric constant. The spacer layer 126 may be made of or include silicon carbide, silicon oxycarbide, silicon oxide, one or more other suitable materials, or a combination thereof. The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

Figure 3C:
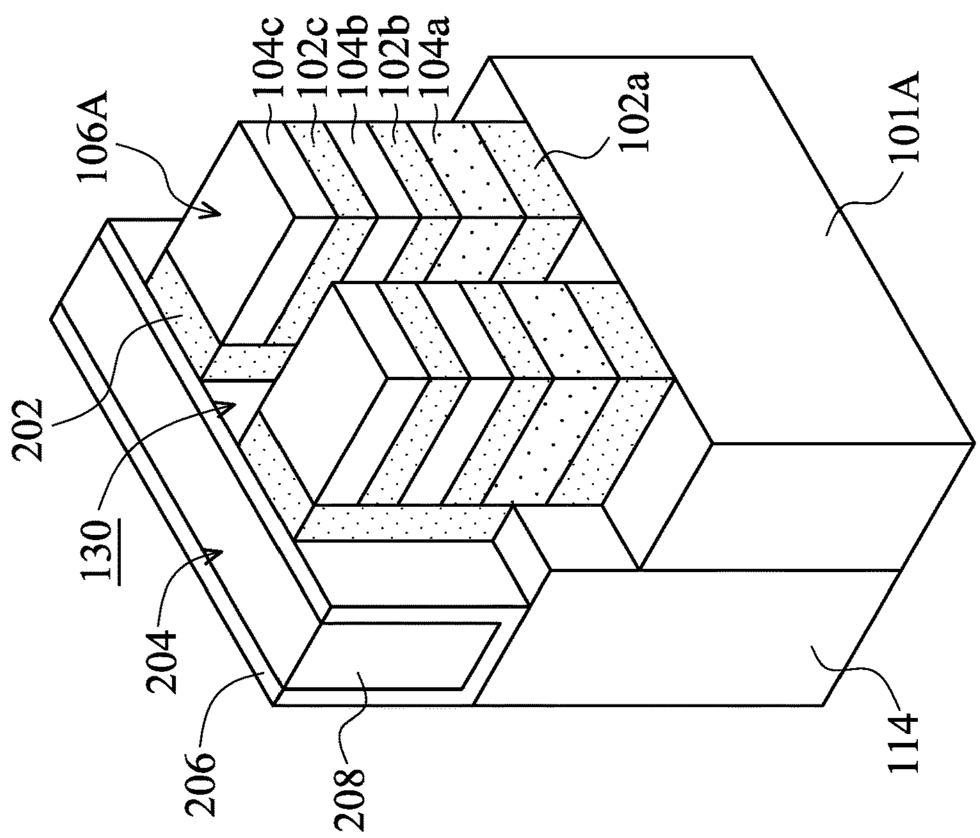
Figure 3C:
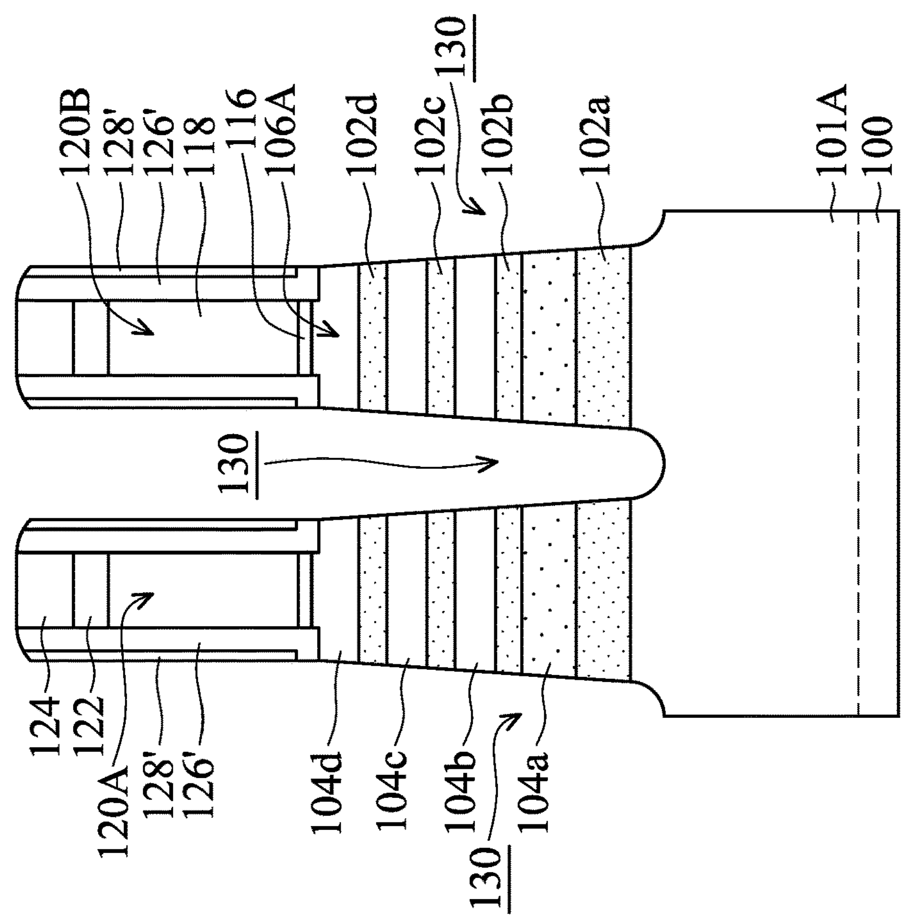

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks 120A and 120B, as shown in FIG. 3C.

FIG. 3C' is a perspective view illustrating a portion of the structure shown in FIG. 3C, in accordance with some embodiments. As shown in FIGS. 3C and 3C', the fin structure 106A is partially removed to form recesses 130, in accordance with some embodiments. The recesses 130 may be used to contain epitaxial structures (such as source/drain structures) that will be formed later. One or more etching processes may be used to form the recesses 130. In some embodiments, a dry etching process is used to form the recesses 130. Alternatively, a wet etching process may be used to form the recesses 130. In some embodiments, each of the recesses 130 penetrates into the fin structure 106A. In some embodiments, the recesses 130 further extend into the semiconductor fin 101A, as shown in FIGS. 3C and 3C'. In some embodiments, the spacer elements 126' and 128' and the recesses 130 are simultaneously formed using the same etching process.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104*d*) is shorter than a lower semiconductor layer (such as the semiconductor layer 104*b*).

However, embodiments of the disclosure have many variations. In some other embodiments, the recesses 130 have substantially vertical sidewalls. In these cases, due to the profile of the recesses 130, an upper semiconductor layer (such as the semiconductor layer 104*d*) is substantially as wide as a lower semiconductor layer (such as the semiconductor layer 104*b*).

Figure 3D:
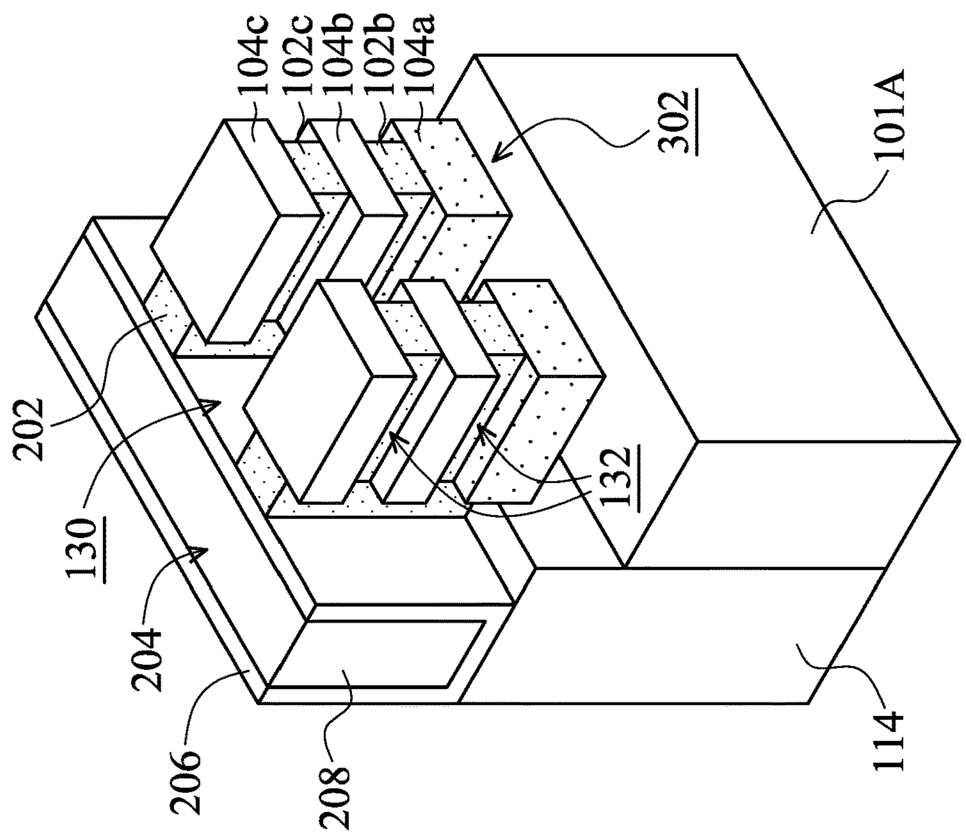
Figure 3D:
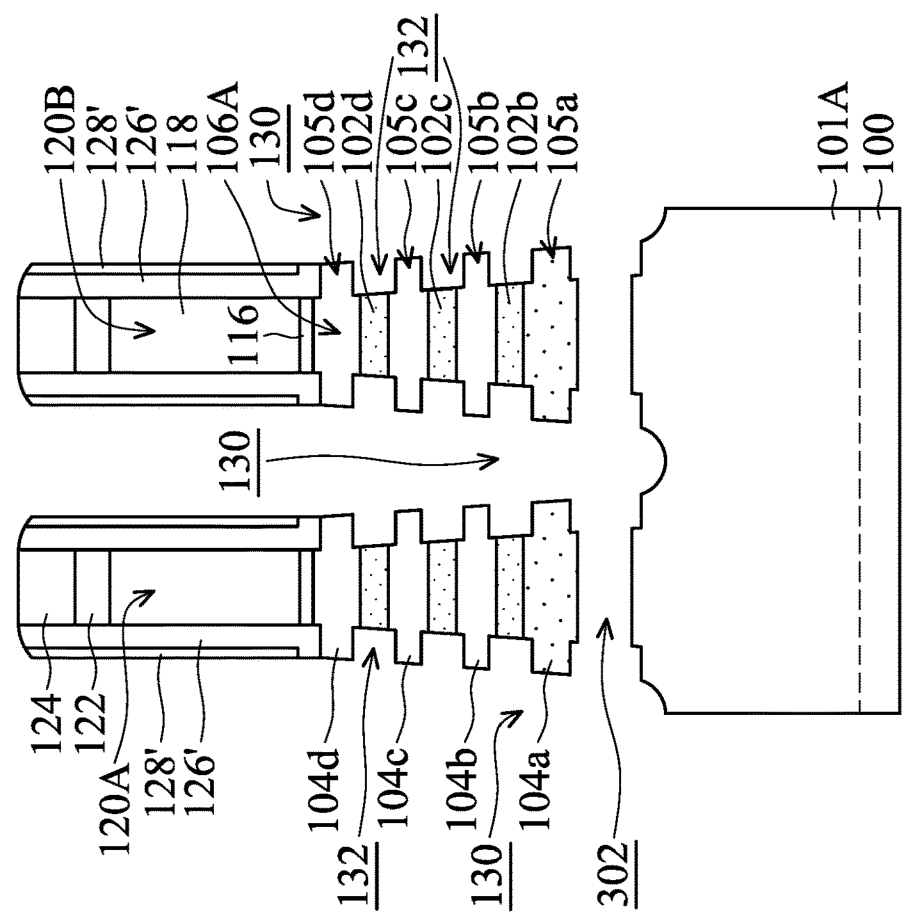

FIG. 3D' is a perspective view illustrating a portion of the structure shown in FIG. 3D, in accordance with some embodiments. As shown in FIGS. 3D and 3D', the semiconductor layers 102*b*-102*d* are laterally etched, in accordance with some embodiments. As a result, edges of the semiconductor layers 102*b*-102*d* retreat from edges of the semiconductor layers 104*a*-104*d*. As shown in FIGS. 3D and 3D', recesses 132 are formed due to the lateral etching of the semiconductor layers 102*b*-102*d*. The recesses 132 may be used to contain inner spacers that will be formed later. The semiconductor layers 102*b*-102*d* may be laterally etched using a wet etching process, a dry etching process, or a combination thereof. In some other embodiments, the semiconductor layers 102*b*-102*d* are partially oxidized before being laterally etched.

In some embodiments, the semiconductor layer 102*a* is also etched during the formation of the recesses 132. As mentioned above, in some embodiments, the semiconductor layer 102*a* has a greater atomic concentration of germanium than that of the semiconductor layer 102*b*, 102*c*, or 102*d*. In some embodiments, the semiconductor layer 102*a* is thicker than the semiconductor layer 102*b*, 102*c*, or 102*d*. As a result, the semiconductor layer 102*a* is etched at a greater etching rate than the semiconductor layers 102*b*-102*d*.

In some embodiments, the semiconductor layers 102*a* is completely removed during the formation the recesses 132. As a result, through holes 302 are formed between the semiconductor fin 101A and the semiconductor layer 104*a*, as shown in FIGS. 3D and 3D' in accordance with some embodiments. Due to the support of the dummy gate stacks 120A and 120B and the dielectric fins 204, the fin structure 106A is prevented from falling down even if the semiconductor layer 102*a* is removed.

The through holes 302 may be used to contain insulating structures that will be formed later. The insulating structures may be used to assist in a subsequent formation of backside self-aligned contacts. In some embodiments, the sacrificial spacers 202 are also partially removed during the formation of the recesses 132 and the through holes 302, as shown in FIG. 3D'.

During the lateral etching of the semiconductor layers 102*b*-102*d*, the semiconductor layers 104*a*-104*d* may also be slightly etched. As a result, edge portions of the semiconductor layers 104*a*-104*d* are partially etched and thus shrink to become edge elements 105*a*-105*d*, as shown in FIG. 3D. As shown in FIG. 3D, each of the edge elements 105*a*-105*d* of the semiconductor layers 104*a*-104*d* is thinner than the corresponding inner portion of the semiconductor layers 104*a*-104*d*. In some embodiments, each of the edge elements 105*a* is thinner than another upper edge element such as the edge elements 105*b*-105*d* since the semiconductor layer 104*a* has a greater atomic concentration of germanium than that of the semiconductor layer 104*b*-104*d*.

Figure 3E:
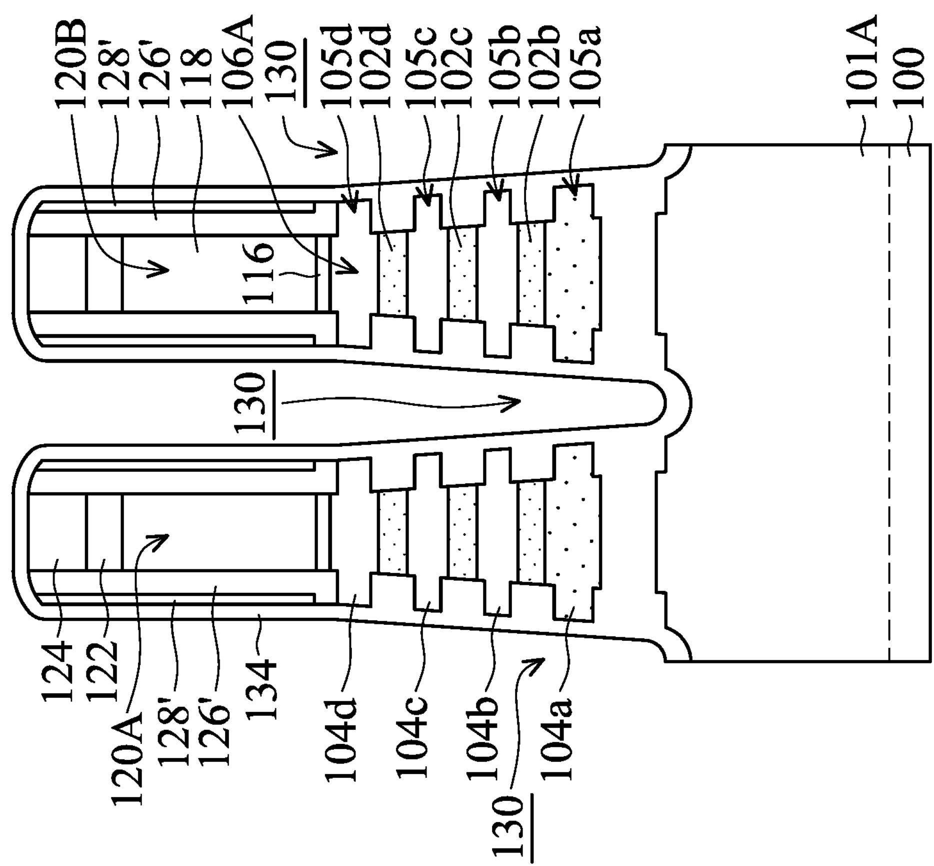

As shown in FIG. 3E, an insulating layer 134 is deposited over the structure shown in FIG. 3D, in accordance with some embodiments. The insulating layer 134 covers the dummy gate stacks 120A and 120B and fills the recesses 132 and the through holes 302. The insulating layer 134 may be made of or include carbon-containing silicon nitride (SiCN), carbon-containing silicon oxynitride (SiOCN), carbon-containing silicon oxide (SiOC), silicon oxide, silicon nitride, one or more other suitable materials, or a combination thereof. In some embodiments, the insulating layer 134 is a single layer. In some other embodiments, the insulating layer 134 includes multiple sub-layers. Some of the sub-layers may be made of different materials and/or contain different compositions. The insulating layer 134 may be deposited using a CVD process, an ALD process, one or more other applicable processes, or a combination thereof.

Figure 3F:
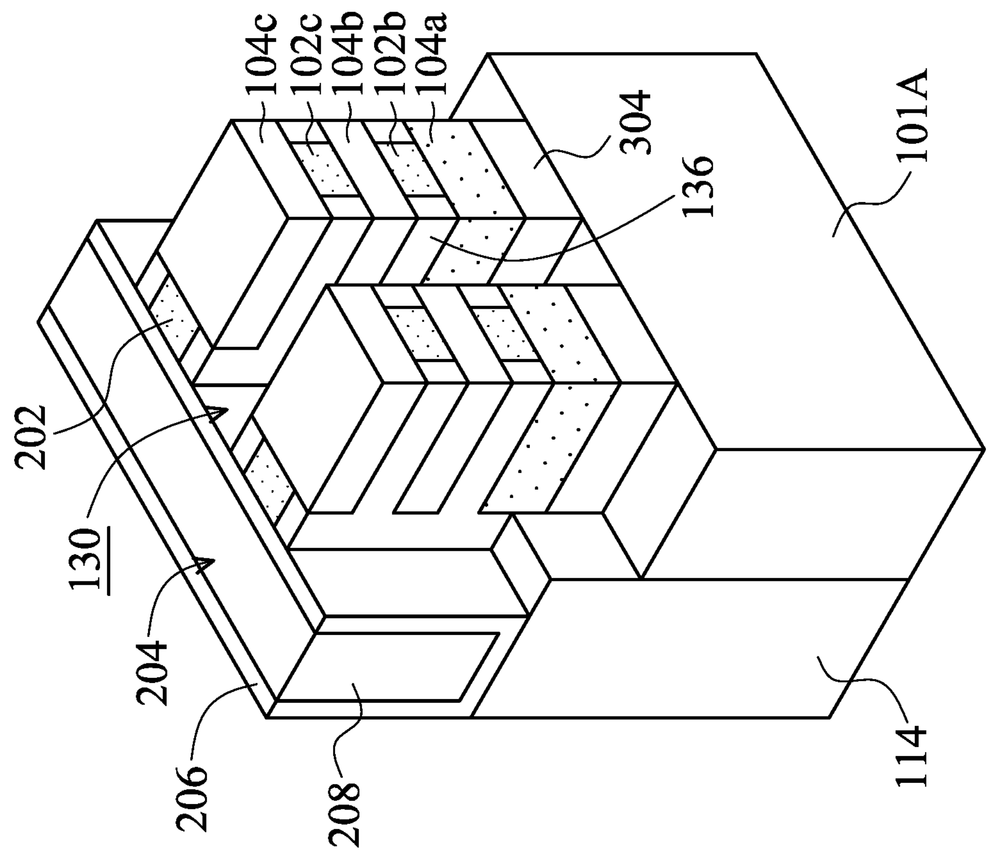
Figure 3F:
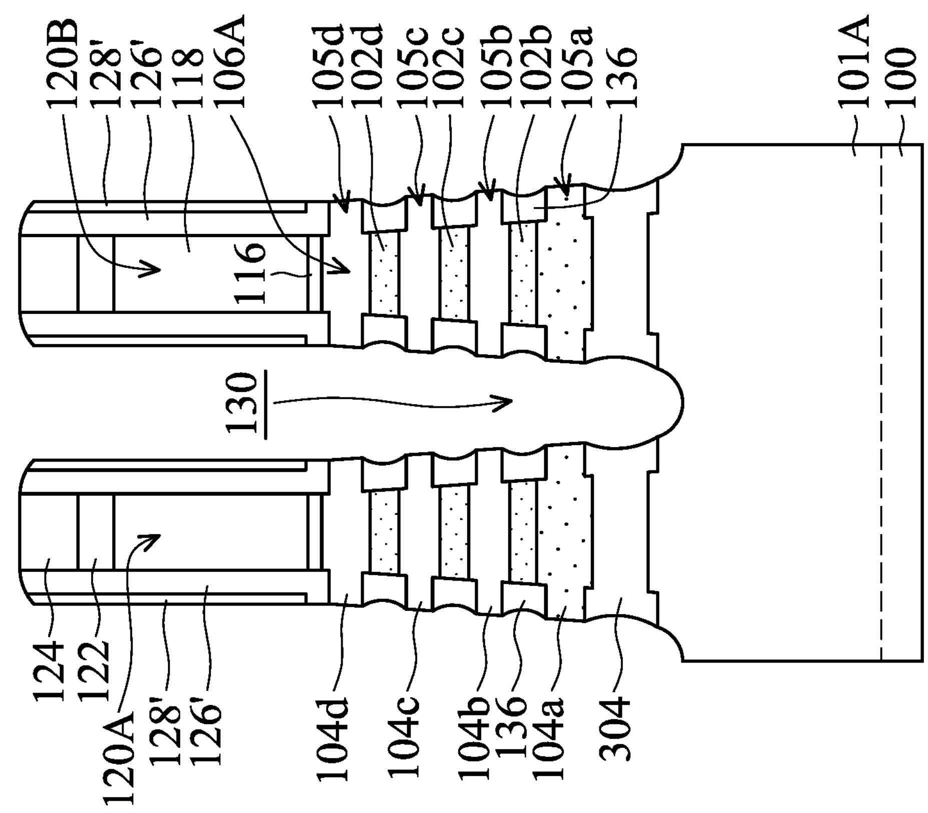

FIG. 3F' is a perspective view illustrating a portion of the structure shown in FIG. 3F, in accordance with some embodiments. As shown in FIGS. 3F and 3F', an etching process is used to partially remove the insulating layer 134, in accordance with some embodiments. The remaining portions of the insulating layer 134 form inner spacers 136 and insulating structures 304, as shown in FIG. 3F. The etching process may include a dry etching process, a wet etching process, or a combination thereof.

Since the inner spacers 136 and the insulating structures 304 are portions of the insulating layer 134, the inner spacers 136 and the insulating structures 304 are made of the same material, in accordance with some embodiments. However, embodiments of the disclosure are not limited thereto. In some other embodiments, the inner spacers 136 and the insulating structures 304 are formed separately from different insulating layers. In these cases, the inner spacers 136 and the insulating structures 304 may be made of different materials.

The insulating structures 304 may be made of or include a low-k material (such as silicon oxide, SiN, SiCN, SiOC, and/or SiOCN), a high-k material (such as hafnium oxide, zirconium oxide, zirconium aluminum oxide, hafnium aluminum oxide, hafnium silicon oxide, and/or aluminum oxide), one or more other suitable materials (such as TiO, TaO, LaO, YO, TaCN, and/or ZrN), or a combination thereof. Each of the insulating structures 304 may has a thickness that is in a range from about 5 nm to about 30 nm. Each of the insulating structures 304 may has a width that is in a range from about 5 nm to about 30 nm.

The inner spacers 136 cover the edges of the semiconductor layers 102*b*-102*d* and the sacrificial spacers 202 that are originally exposed by the recesses 132. The inner spacers 136 may be used to prevent subsequently formed epitaxial structures (that function as, for example, source/drain structures) from being damaged during a subsequent process for removing the sacrificial layers 102*b*-102*d* and the sacrificial spacers 202. In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fin 101A originally covered by the insulating layer 134 are exposed by the recesses 130, as shown in FIG. 3F. The edges of the semiconductor layers 104*a*-104*d* are exposed by the recesses 130, as shown in FIGS. 3F and 3F'.

Figure 3G:
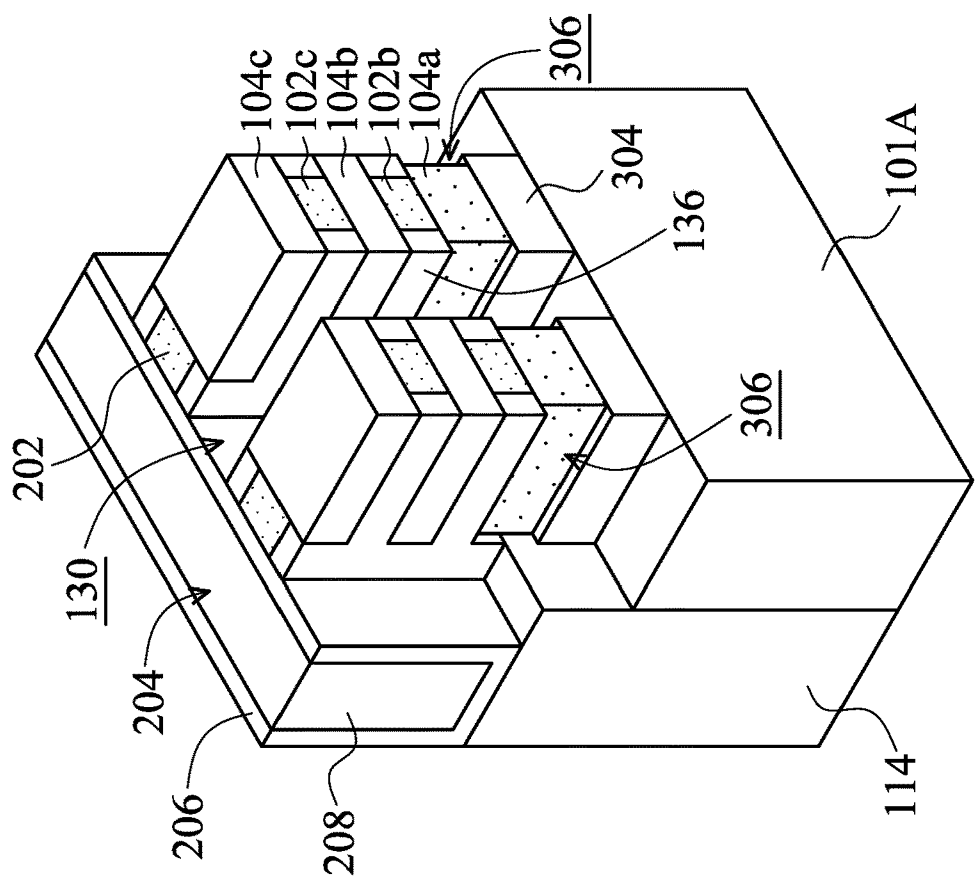
Figure 3G:
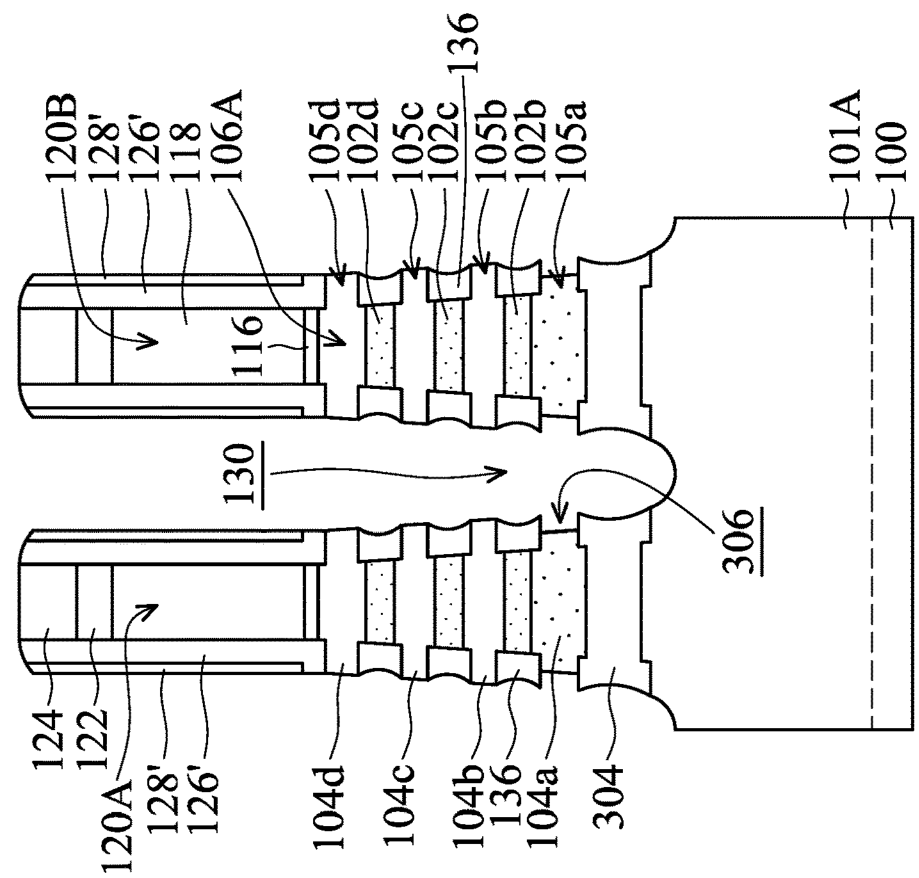

FIG. 3G' is a perspective view illustrating a portion of the structure shown in FIG. 3G, in accordance with some embodiments. As shown in FIGS. 3G and 3G', the semiconductor layer 104*a* is laterally etched, in accordance with some embodiments. As a result, edges of the semiconductor layer 104*a* retreat from edges of the inner spacers 136 and the insulating structures 304. As shown in FIGS. 3G and 3G', recesses 306 are formed due to the lateral etching of the semiconductor layer 104*a*. The recesses 306 may be used to contain insulating spacers that will be formed later. The semiconductor layer 104*a* may be laterally etched using a wet etching process, a dry etching process, or a combination thereof. In some other embodiments, the semiconductor layer 104 is partially oxidized before being laterally etched. The depth of each of the recesses may be in a range from about 1 nm to about 10 nm.

In some embodiments, the semiconductor layers 104*b*-104*d* are substantially not or slightly etched during the formation of the recesses 306. As mentioned above, in some embodiments, the semiconductor layer 104*a* has a greater atomic concentration of germanium than that of the semiconductor layer 104*b*, 104*c*, or 104*d*. In some embodiments, the semiconductor layer 104*b*, 104*c*, and 104*d* are substantially free of germanium. As a result, the semiconductor layer 104*a* is etched at a greater etching rate than the semiconductor layers 104*b*-104*d*. In some embodiments, the semiconductor layers 104*a* is laterally etched to form the recesses 306 while the semiconductor layers 104*b*-104*d* are substantially not etched, as shown in FIGS. 3G and 3G' in accordance with some embodiments. During the lateral etching of the semiconductor layer 104*a*, the semiconductor layers 102*b*-102*d* are protected by the inner spacers 136 without being etched.

Figure 3H:
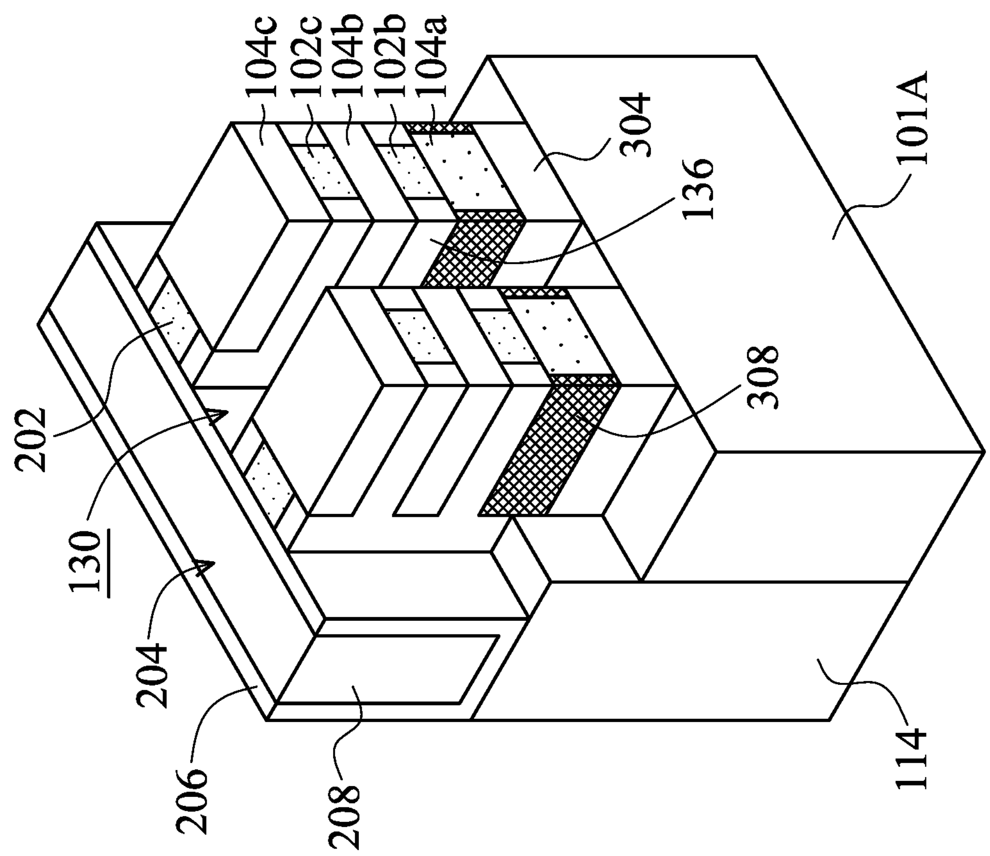
Figure 3H:
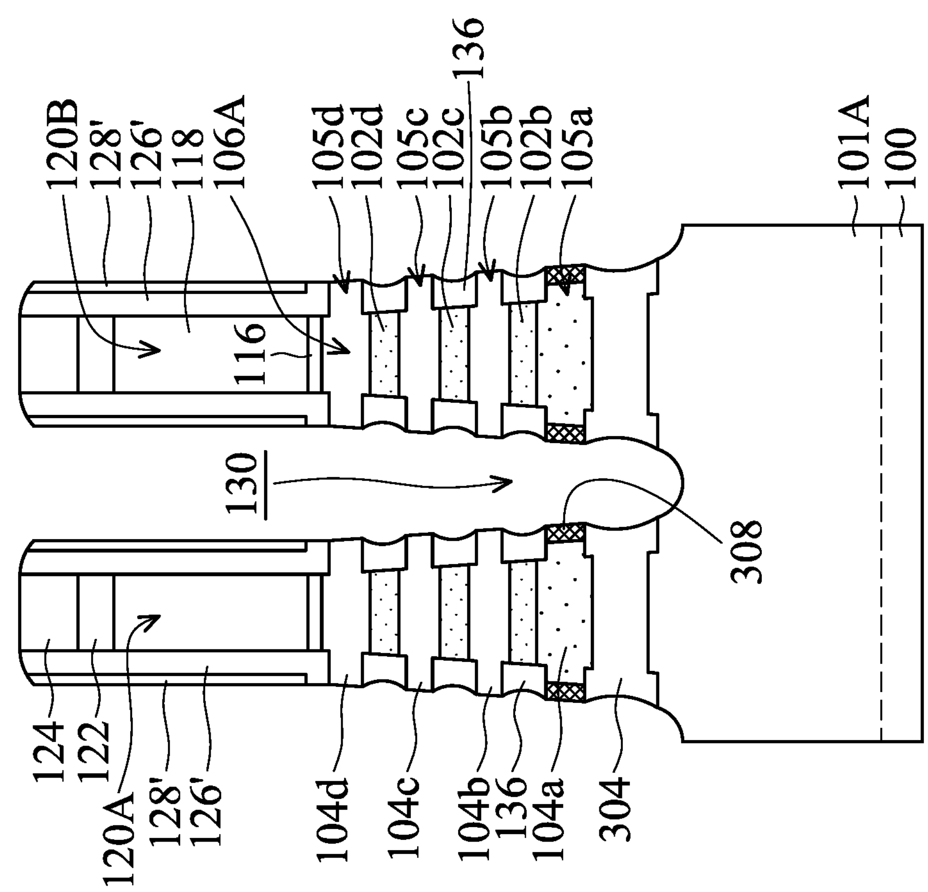

FIG. 3H' is a perspective view illustrating a portion of the structure shown in FIG. 3H, in accordance with some embodiments. As shown in FIGS. 3H and 3H', insulating spacers 308 are formed to cover the edges of the semiconductor layer 104*a* originally exposed by the recesses 306, in accordance with some embodiments. The material and formation method of the insulating spacers 308 may be the same as or similar to those of the inner spacers 136. In some embodiments, the insulating spacers 308 and the inner spacers 136 are made of the same material. In some other embodiments, the insulating spacers 308 and the inner spacers 136 are made of different materials.

In some embodiments, similar to the embodiments shown in FIG. 3E, an insulating layer is deposited over the structure shown in FIG. 3G or 3G', in accordance with some embodiments. The insulating layer covers the dummy gate stacks 120A and 120B and the fin structure 106A, and fills the recesses 306. The insulating layer may be made of or include carbon-containing silicon nitride (SiCN), carbon-containing silicon oxynitride (SiOCN), carbon-containing silicon oxide (SiOC), silicon oxide, silicon nitride, one or more other suitable materials, or a combination thereof. In some embodiments, the insulating layer is a single layer. In some other embodiments, the insulating layer includes multiple sub-layers. Some of the sub-layers may be made of different materials and/or contain different compositions. The insulating layer may be deposited using a CVD process, an ALD process, one or more other applicable processes, or a combination thereof.

Afterwards, similar to the embodiments shown in FIGS. 3F and 3F', an etching process is used to partially remove the insulating layer, in accordance with some embodiments. The remaining portions of the insulating layer form the insulating spacers 308, as shown in FIGS. 3H and 3H'. The etching process may include a dry etching process, a wet etching process, or a combination thereof. In some embodiments, each of the insulating spacers 308 is in direct contact with one of the inner spacers 136. For example, one of the insulating spacers 308 is in direct contact with the bottom-most inner spacer 136, as shown in FIGS. 3H and 3H'. In some embodiments, each of the insulating spacers 308 is in direct contact with the semiconductor layer 104*a* that functions as base structures. In some embodiments, each of the insulating spacers 308 is in direct contact with the respective insulating structure 304 thereunder.

In some embodiments, after the etching process for forming the insulating spacers 308, portions of the semiconductor fin 101A originally covered by the insulating layer are exposed by the recesses 130, as shown in FIGS. 3H and 3H'. The edges of the semiconductor layers 104*b*-104*d* are exposed by the recesses 130, as shown in FIGS. 3H and 3H'.

Figures 3I, 3J:
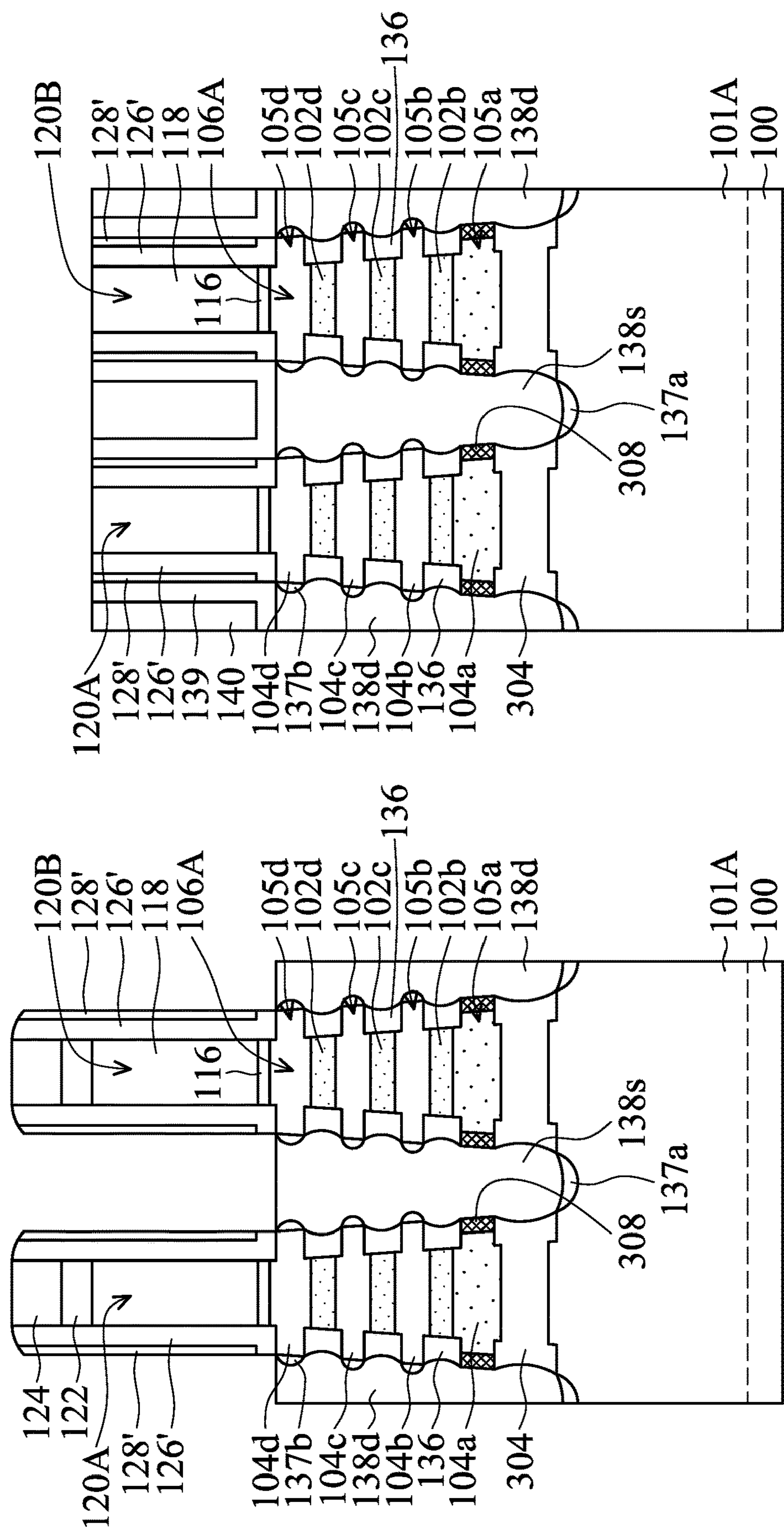

As shown in FIG. 3I, epitaxial structures 138*s* and 138*d* are formed beside the dummy gate stacks 120A and 120B, in accordance with some embodiments. In some embodiments, the epitaxial structures 138*s* and 138*d* fill the recesses 130, as shown in FIG. 3I. In some other embodiments, the epitaxial structures 138*s* and 138*d* overfill the recesses 130. In these cases, the top surfaces of the epitaxial structures 138*s* and 138*d* may be higher than the top surface of the dummy gate dielectric layer 116. In some other embodiments, the epitaxial structures 138*s* and 138*d* partially fill the recesses 130.

In some embodiments, the epitaxial structures 138*s* and 138*d* connect to the semiconductor layers 104*b*-104*d*. Each of the semiconductor layers 104*b*-104*d* is sandwiched between the epitaxial structures 138*s* and 138*d*. In some embodiments, the epitaxial structures 138*s* function as source structures, and the epitaxial structures 138*d* function as drain structures. In some embodiments, the epitaxial structures 138*s* and 138*d* are p-type doped regions. The epitaxial structures 138*s* and 138*d* may include epitaxially grown silicon germanium (SiGe), epitaxially grown silicon, or another suitable epitaxially grown semiconductor material.

However, embodiments of the disclosure are not limited thereto. In some other embodiments, the epitaxial structures 138*s* and 138*d* are n-type doped regions. The epitaxial structures 138*s* and 138*d* may include epitaxially grown silicon, epitaxially grown silicon carbide (SiC), epitaxially grown germanium, or another suitable epitaxially grown semiconductor material.

In some embodiments, each of the epitaxial structures 138*s* and 138*d* includes a first portion 137*a* and second portions 137*b*. The first portion 137*a* is positioned at the bottom portion of the epitaxial structure 138*s* or 138*d*. The second portions 137*b* are positioned adjacent to the semiconductor layer 104*b*, 104*c*, or 104*d*. The first portion 137*a* and the second portions 137*b* may have different compositions than other portions of the epitaxial structure 138*s* or 138*d*. In some embodiments, the first portion 137*a* and second portions 137*b* have a lower dopant concentration than the other portions of the epitaxial structure 138*s* or 138*d*. In some embodiments, the first portion 137*a* is substantially free of dopant. The first portion 137*a* may be used to prevent or reduce current leakage from the epitaxial structures 138*s* and 138*d*. In some embodiments, the first portion 137*a* and second portions 137*b* have a lower atomic concentration of germanium than the other portions of the epitaxial structure 138*s* or 138*d*.

In some embodiments, the epitaxial structures 138*s* and 138*d* are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 138*s* and 138*d* are doped with one or more suitable p-type dopants. For example, the epitaxial structures 138*s* and 138*d* are SiGe source/drain features or Si source/drain features that are doped with boron (B), gallium (Ga), indium (In), or another suitable dopant. In some other embodiments, the epitaxial structures 138 are doped with one or more suitable n-type dopants. For example, the epitaxial structures 138*s* and 138*d* are Si source/drain features doped with phosphor (P), antimony (Sb), or another suitable dopant.

In some embodiments, the epitaxial structures 138*s* and 138*d* are doped in-situ during their epitaxial growth. The initial reaction gas mixture for forming the epitaxial structures 138*s* and 138*d* contains dopants. In some other embodiments, the epitaxial structures 138*s* and 138*d* are not doped during the growth of the epitaxial structures 138*s* and 138*d*. Instead, after the formation of the epitaxial structures 138*s* and 138*d*, the epitaxial structures 138*s* and 138*d* are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138*s* and 138*d* are further exposed to one or more annealing processes to activate the dopants. For example, a rapid thermal annealing process is used.

As shown in FIG. 3J, a contact etch stop layer 139 and a dielectric layer 140 are formed to cover the epitaxial structures 138*s* and 138*d*, and to surround the dummy gate stacks 120A and 120B, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3I. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer form the contact etch stop layer 139 and the dielectric layer 140, respectively. The planarization process may include a CMP process, a grinding process, an etching process, a dry polishing process, one or more other applicable processes, or a combination thereof. In some embodiments, the mask layers 122 and 124 are removed during the planarization process. In some embodiments, after the planarization process, the top surfaces of the contact etch stop layer 139, the dielectric layer 140, and the dummy gate electrodes 118 are substantially coplanar.

Figure 2G:
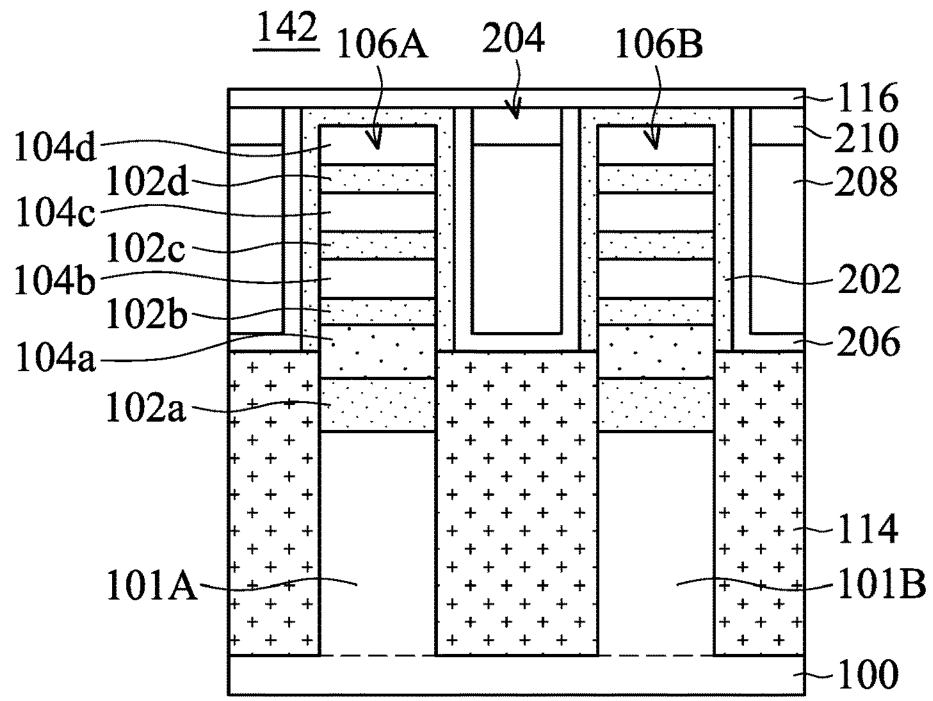
Figures 3K, 3L:
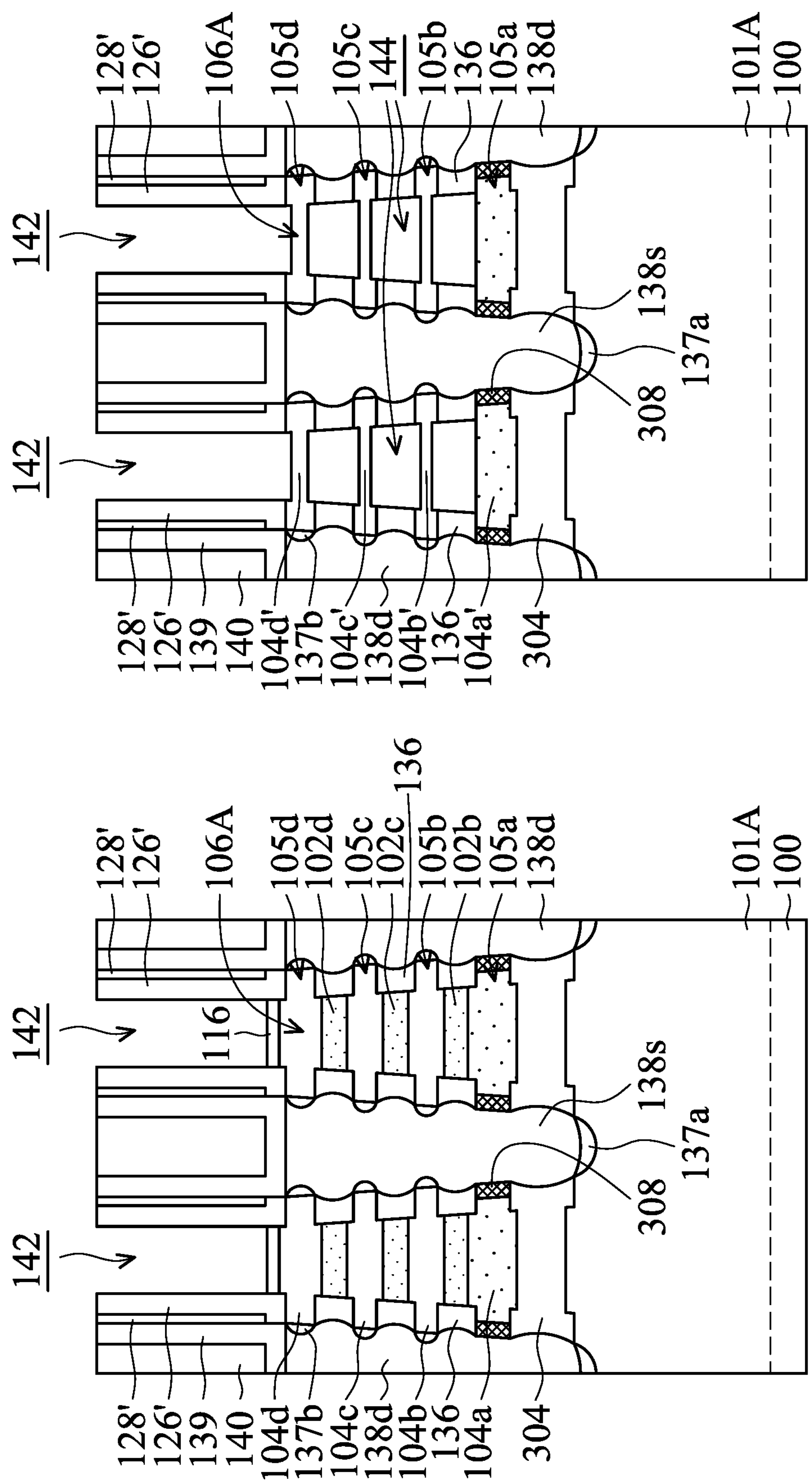
Figure 3N:
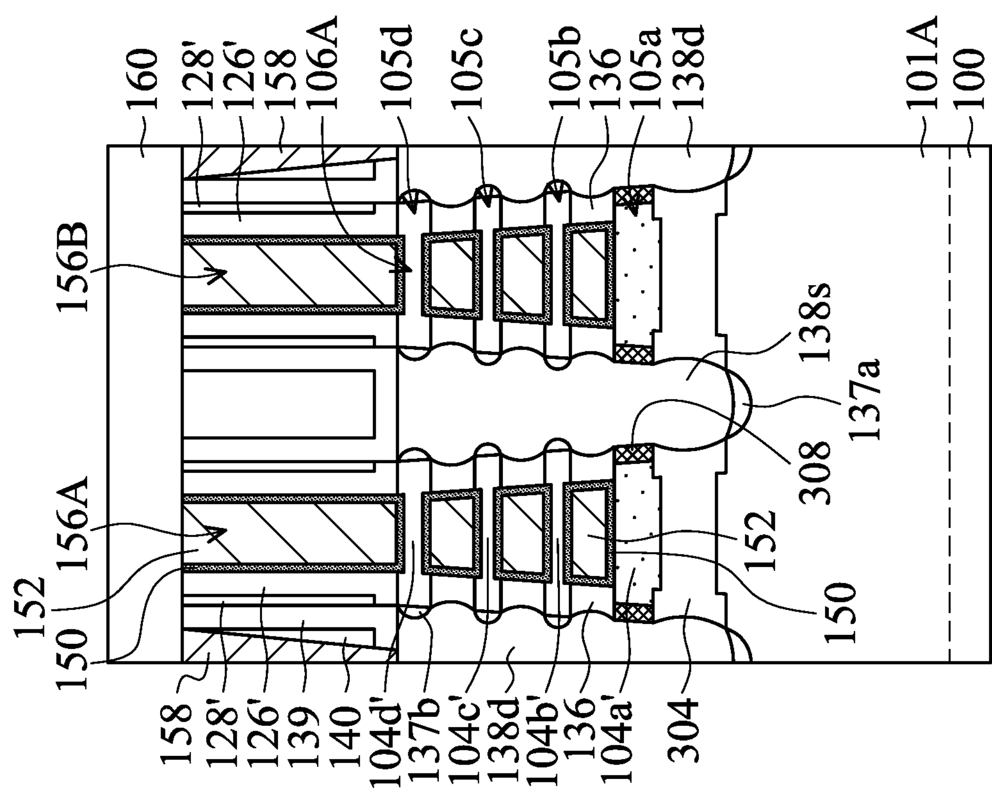

As shown in FIGS. 2G and 3K, one or more etching processes are used to remove the dummy gate electrodes 118 to form trenches 142, in accordance with some embodiments. The trenches 142 are surrounded by the dielectric layer 140. The trenches 142 expose the dummy gate dielectric layer 116.

Figure 2H:
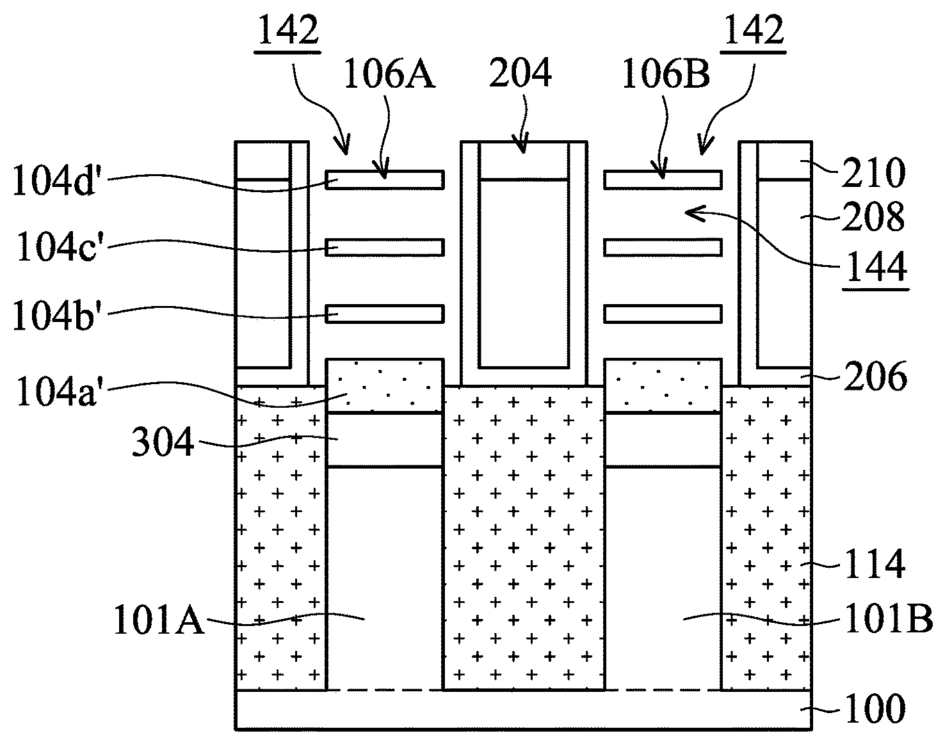

As shown in FIGS. 2H and 3L, the dummy gate dielectric layer 116, the semiconductor layers 102*b*-102*d* (that function as sacrificial layers), and the sacrificial spacers 202 are removed, in accordance with some embodiments. In some embodiments, an etching process is used to remove the semiconductor layers 102*b*-102*d* and the sacrificial spacers 202. As a result, recesses 144 are formed, as shown in FIGS. 2H and 3L.

Due to high etching selectivity, the semiconductor layers 104*b*-104*d* are slightly (or substantially not) etched. The remaining portions of the semiconductor layers 104*b*-104*d* form multiple semiconductor nanostructures 104*b*'-104*d*' of the fin structures 106A and 106B, as shown in FIGS. 2H and 3L. The semiconductor nanostructures 104*b*'-104*d*' are constructed by or made up of the remaining portions of the semiconductor layers 104*b*-104*d*. The semiconductor nanostructures 104*b*'-104*d*' suspended over the semiconductor fin 101A or 101B may function as channel structures of transistors.

In some embodiments, the etchant used for removing the semiconductor layers 102*b*-102*d* also slightly removes the semiconductor layers 104*b*-104*d* that form the semiconductor nanostructures 104*b*'-104*d*'. As a result, the obtained semiconductor nanostructures 104*b*'-104*d*' become thinner after the removal of the semiconductor layers 102*b*-102*d*. In some embodiments, each of the semiconductor nanostructures 104*b*'-104*d*' is thinner than the edge portions 105*b*-105*d* since the edge portions 105*b*-105*d* are surrounded by other elements and thus are prevented from being reached and etched by the etchant.

In some embodiments, due to the protection of the semiconductor layer 102*b* and the etch selectivity of the semiconductor layers 104*a*, the etchant used for removing the semiconductor layers 102*b*-102*d* slightly (or substantially not) etches the semiconductor layer 104*a*. As a result, the semiconductor layer 104*a* that remains form base structures 104*a'*.

After the removal of the semiconductor layers 102*b*-102*d* (that function as sacrificial layers), the recesses 144 are formed. The recesses 144 connect to the trench 142 and surround each of the semiconductor nanostructures 104*b*'-104*d*'. As shown in FIG. 3L, even if the recesses 144 between the semiconductor nanostructures 104*b*'-104*d*' are formed, the semiconductor nanostructures 104*b*'-104*d*' remain being held by the epitaxial structures 138*s* and 138*d*. Therefore, after the removal of the semiconductor layers 102*b*-102*d* (that function as sacrificial layers), the released semiconductor nanostructures 104*b*'-104*d*' are prevented from falling down.

During the removal of the semiconductor layers 102*b*-102*d* (that function as sacrificial layers), the inner spacers 136 protect the epitaxial structures 138*s* and 138*d* from being etched or damaged. The quality and reliability of the semiconductor device structure are improved.

Figure 2I:
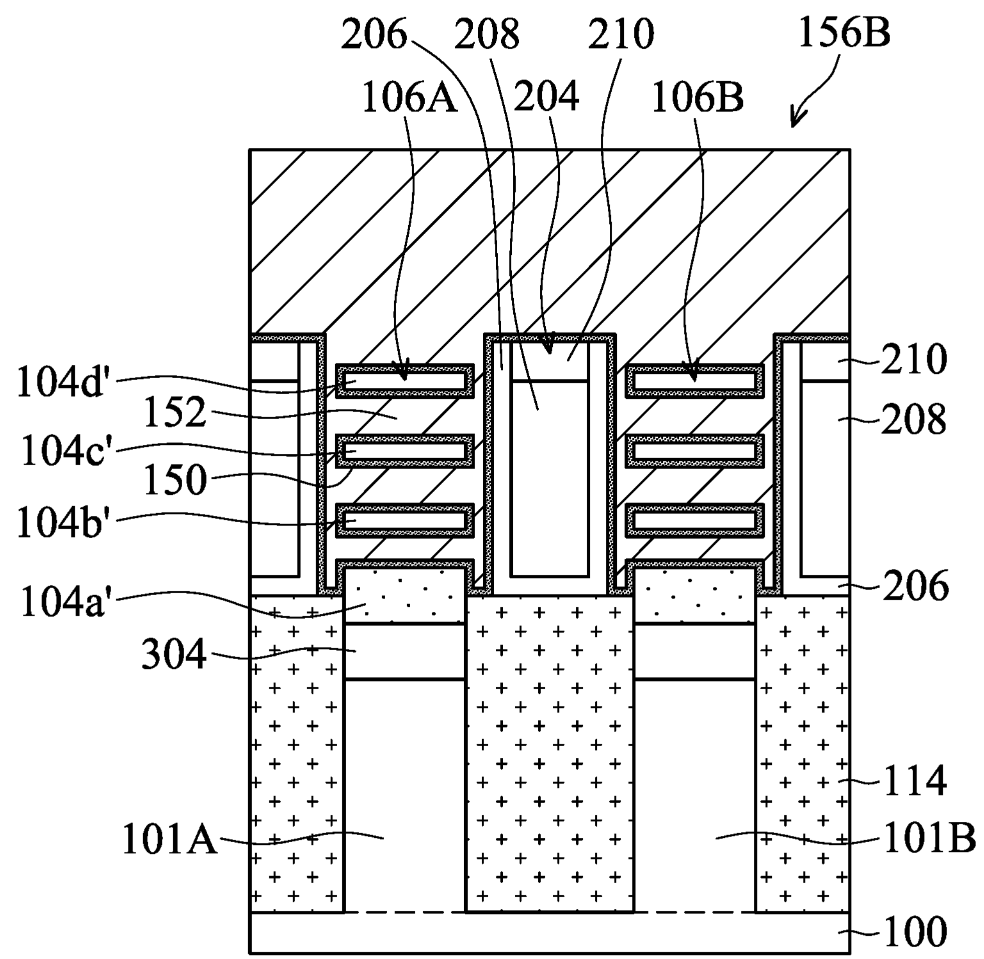
Figure 3M:
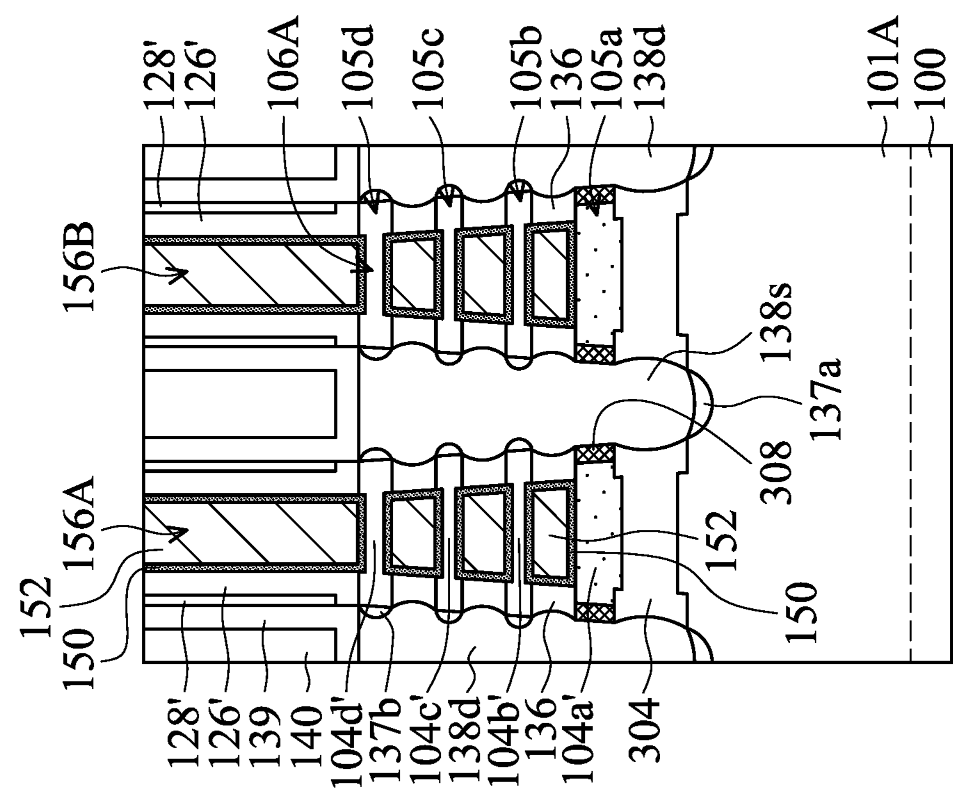
Figure 3P:
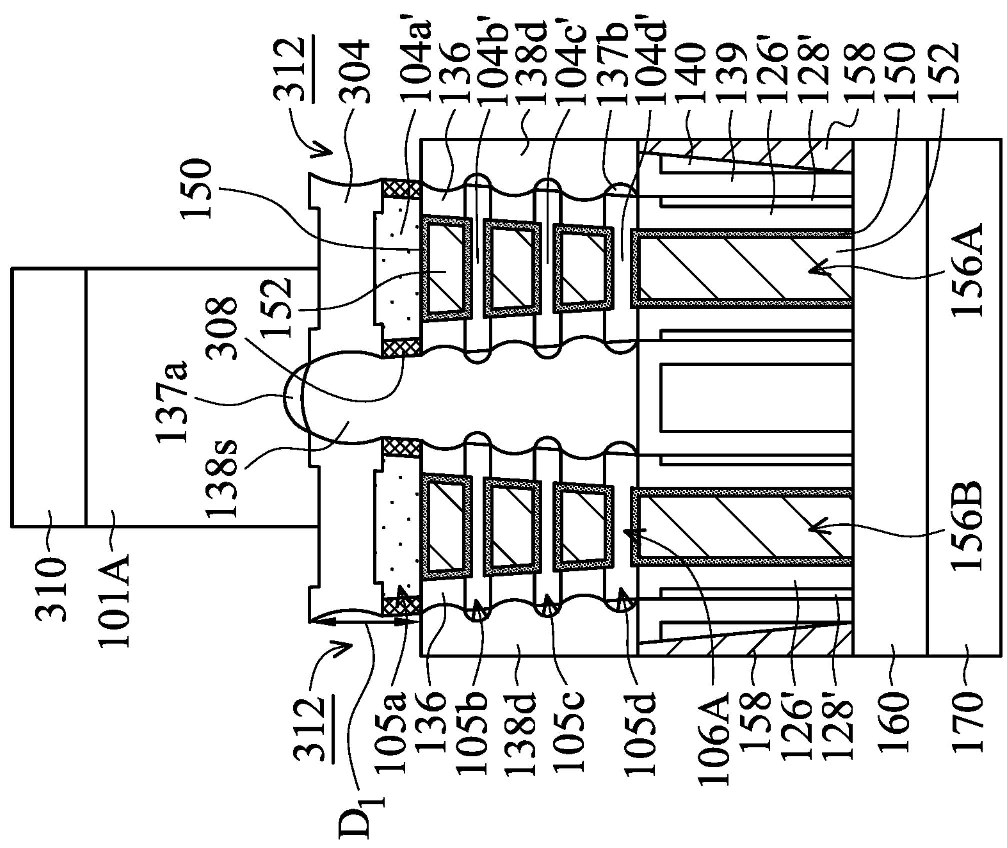

As shown in FIGS. 2I and 3M, metal gate stacks 156A and 156B are formed to fill the trenches 142, in accordance with some embodiments. The metal gate stacks 156A and 156B extend into the recesses 144 to wrap around each of the semiconductor nanostructures 104*b*'-104*d*'.

Each of the metal gate stacks 156A and 156B includes multiple metal gate stack layers. Each of the metal gate stacks 156A and 156B may include a gate dielectric layer 150 and a metal gate electrode 152. The metal gate electrode 152 may include a work function layer. The metal gate electrode 152 may further include a conductive filling. In some embodiments, the formation of the metal gate stacks 156A and 156B involves the deposition of multiple metal gate stack layers over the dielectric layer 140 to fill the trenches 142 and the recesses 144. The metal gate stack layers extend into the recesses 144 to wrap around each of the semiconductor nanostructures 104*b*'-104*d*'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104*b*'-104*d*'. The interfacial layers are very thin and are made of, for example, silicon oxide or germanium oxide. In some embodiments, the interfacial layers are formed by applying an oxidizing agent on the surfaces of the semiconductor nanostructures 104*b*'-104*d*'. For example, a hydrogen peroxide-containing liquid may be applied or provided on the surfaces of the semiconductor nanostructures 104*b*'-104*d*' so as to form the interfacial layers.

The work function layer of the metal gate electrode 152 may be used to provide the desired work function for transistors to enhance device performance including improved threshold voltage. In some embodiments, the work function layer is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some other embodiments, the work function layer is used for forming an NMOS device. The work function layer is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electroless plating process, one or more other applicable processes, or a combination thereof.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive fillings of the metal gate electrodes 152 are made of or include a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIGS. 2I and 3M. A portions of the metal gate stack 156B is between the semiconductor nanostructures 104*b*'-104*d*' and the dielectric fins 204, as shown in FIG. 2I.

In some embodiments, the conductive filling does not extend into the recesses 144 since the recesses 144 are small and have been filled with other elements such as the gate dielectric layer 150 and the work function layer. However, embodiments of the disclosure are not limited thereto. In some other embodiments, a portion of the conductive filling extends into the recesses 144, especially for the lower recesses 144 that may have larger space.

As shown in FIG. 3N, frontside conductive contacts 158 and an interconnection structure 160 are formed, in accordance with some embodiments. In some embodiments, each of the frontside conductive contacts is electrically connected to one of the epitaxial structures 138*d*. In some embodiments, no frontside conductive contact is formed to be in electrical contact with the epitaxial structure 138*s*. A backside conductive contact will be formed later to be in electrical contact with the epitaxial structure 138*s*. Therefore, the metal layer routing is significantly relaxed.

The formation of the frontside conductive contacts 158 may involve one or more patterning processes for forming contact openings, one or more deposition processes for forming conductive materials into the conductive openings, and one or more planarization processes to accomplish the formation of the frontside conductive contacts 158. The frontside conductive contacts 158 may be made of or include Co, Ru, W, Ti, TiN, Ta, TaN, Mo, Ni, Cu, Au, one or more other suitable materials, or a combination thereof.

In some embodiments, a metal-semiconductor compound layer (not shown) is formed between the frontside conductive contact 158 and the epitaxial structure 138*d*. The metal-semiconductor compound layer may be a metal silicide material that contains titanium, nickel, cobalt, tantalum, platinum, tungsten, one or more other noble metals, one or more other refractory metals, one or more other rare earth metals, one or more other suitable materials, or a combination thereof. Alternatively, the metal-semiconductor compound layer may be a metal-containing material that contains no silicon. For example, the metal-semiconductor compound layer may contain germanium and a metal element such as titanium, nickel, cobalt, tantalum, platinum, tungsten, one or more other noble metals, one or more other refractory metals, one or more other rare earth metals, one or more other suitable materials, or a combination thereof.

The interconnection structure 160 may include middle-end-of line structures and back-end-of-line structures. The interconnection structure 160 may include multiple dielectric layers, multiple conductive contacts, multiple conductive lines, and multiple conductive vias. The formation of the interconnection structure 160 may involve multiple deposition processes, multiple patterning processes, and multiple planarization processes.

Figure 3O:
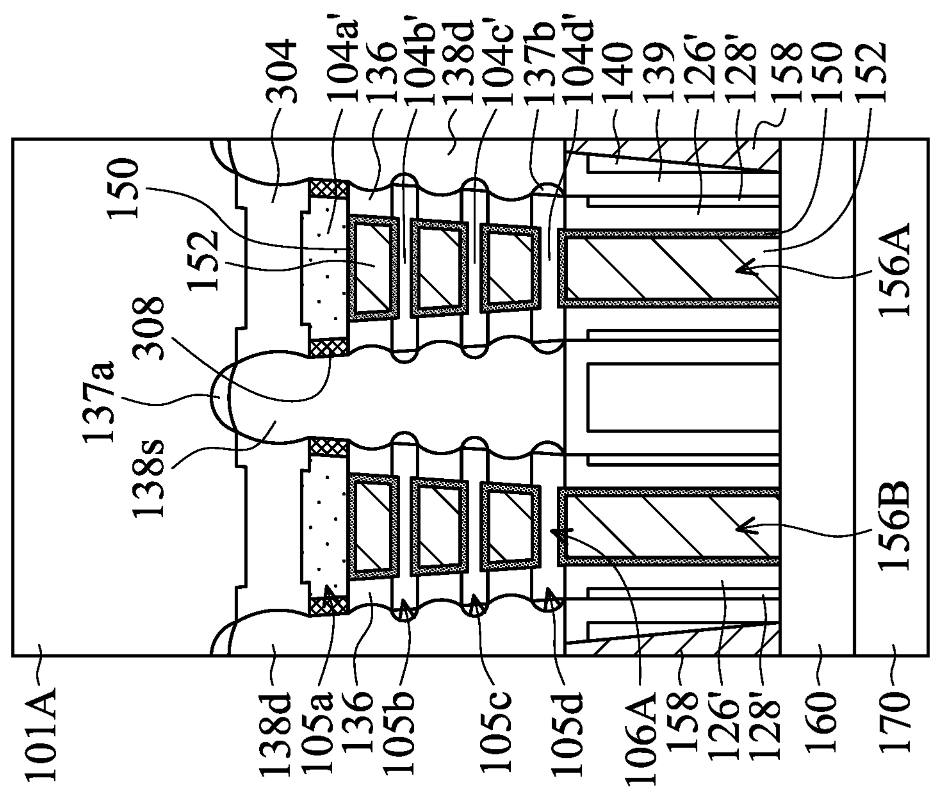

As shown in FIG. 3O, a carrier substrate 170 is bonded onto the interconnection structure 160, in accordance with some embodiments. The carrier substrate 170 may be a semiconductor wafer such as a silicon wafer, a silicon-on-insulator (SOI) wafer, or a glass wafer. After bonding with the carrier substrate 170, the structure is flipped upside down such that the bottom surface of the semiconductor substrate 100 faces upwards.

In some embodiments, a thinning process is then used to thin down the semiconductor substrate 100, as shown in FIG. 3O. In some embodiments, after the thinning process, the semiconductor substrate 100 is removed such that the semiconductor fin 101A and the isolation structure 114 are exposed. The thinning process may include a CMP process, a grinding process, a dry polishing process, an etching process, one or more other applicable processes, or a combination thereof.

As shown in FIG. 3P, a mask element 310 is formed over the portion of the semiconductor fin 101A that is directly above the epitaxial structure 138*s*, in accordance with some embodiments. In some embodiments, the mask element 310 further covers portions of the insulating structures 304 and a portion of the isolation structure 114. The mask element 310 may be a patterned photoresist layer or a patterned dielectric element.

Afterwards, with the mask element 310 as an etching mask, one or more etching processes are used to partially remove the semiconductor fin 101A and portions of the epitaxial structures 138*d*, as shown in FIG. 3P in accordance with some embodiments. As a result, openings 312 that expose the remaining epitaxial structures 138*d* are formed. In some embodiments, the first portions 137*a* of the epitaxial structures 138*d* are completely removed. Due to the protection of the insulating spacers 308, the base structures 104*a*' are prevented from being damaged by the etchant used for forming the openings 312. As shown in FIG. 3P, the portion of the opening 312 extending from the surface of the insulating structure 304 to the epitaxial structure 138*d* has a depth $D_1$. The depth $D_1$ corresponds to the recess depth of the epitaxial structure 138*d*. The depth $D_1$ may be in a range from about 3 nm to about 35 nm.

Figure 3Q:
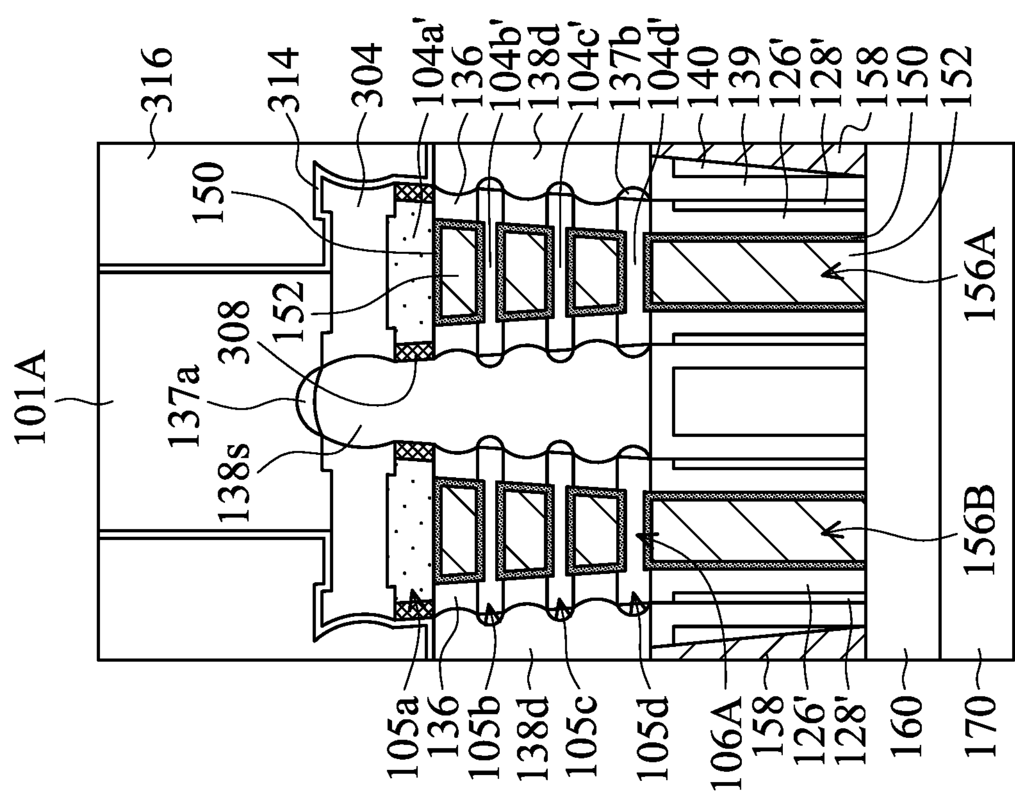

As shown in FIG. 3Q, after removing the mask element 310, etch stop elements 314 and dielectric fillings 316 are formed in the openings 312, in accordance with some embodiments. The etch stop elements 314 extend along sidewalls of the remaining semiconductor fin 101A, sidewalls of the insulating structures 304, side surfaces of the insulating spacers 308, and bottoms of the remaining epitaxial structures 138*d*. The dielectric fillings 316 may fill the remaining space of the openings 312. Each of the dielectric fillings 316 may be a single layer structure. Alternatively, each of the dielectric fillings 316 may be a multilayer structure that includes multiple sub-layers. Some of the sub-layers may be made of different materials. The etch stop elements 314 and the dielectric fillings 316 may be used to significantly prevent short circuiting between the backside conductive contact (that will be formed later) and other conductive elements such as a nearby backside conductive contact or a nearby drain structure.

The etch stop elements 314 may be made of or include silicon nitride, silicon oxynitride, silicon carbide, aluminum oxide, one or more other suitable materials, or a combination thereof. The dielectric fillings 316 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited to overfill the openings 312. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to remove the etch stop material layer and the dielectric material layer outside of the openings 312. As a result, the remaining portions of the etch stop material layer and the dielectric material layer form the etch stop elements 314 and the dielectric fillings 316, respectively. The planarization process may include a CMP process, a grinding process, an etching process, a dry polishing process, one or more other applicable processes, or a combination thereof. In some embodiments, after the planarization process, the top surfaces of the etch stop elements 314, the dielectric fillings 316, and the remaining semiconductor fins 101A are substantially coplanar.

Figure 3R:
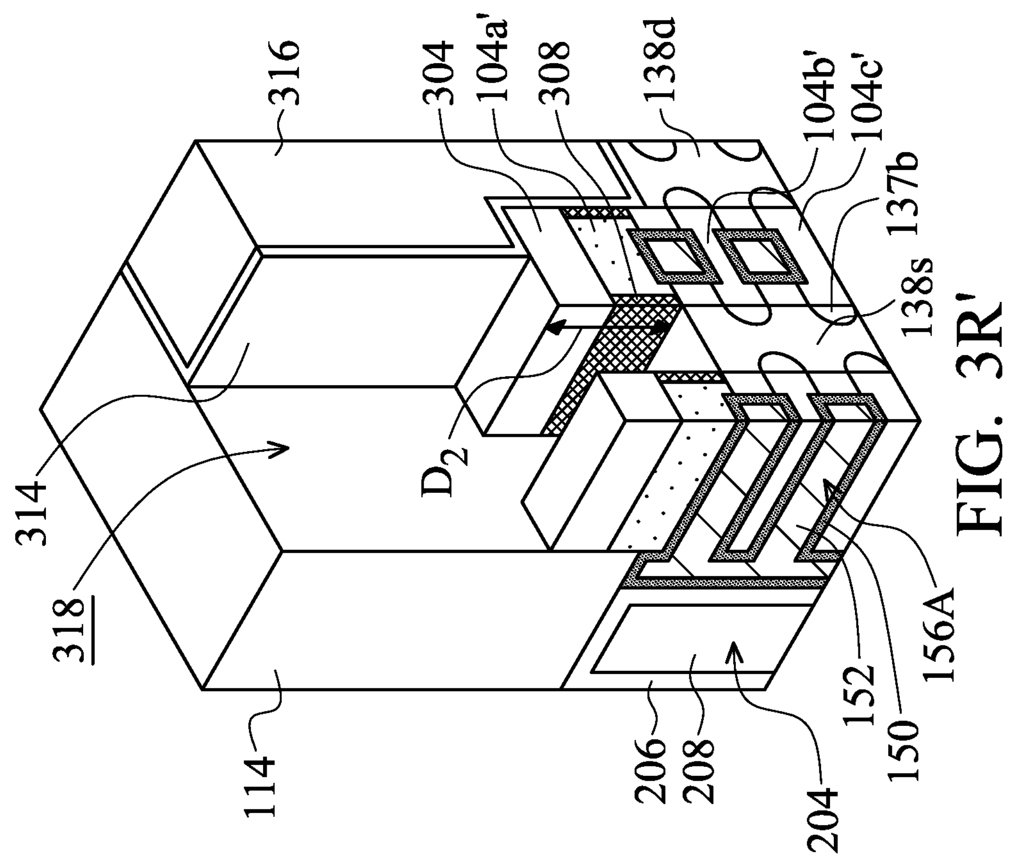
Figure 3R:
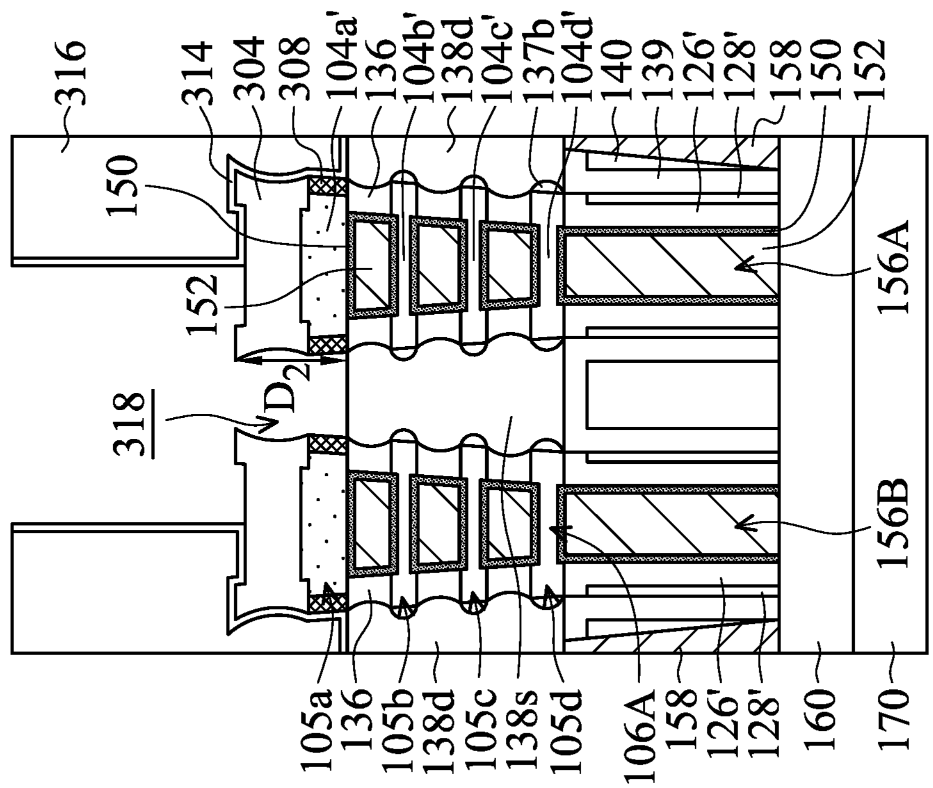
Figure 3S:
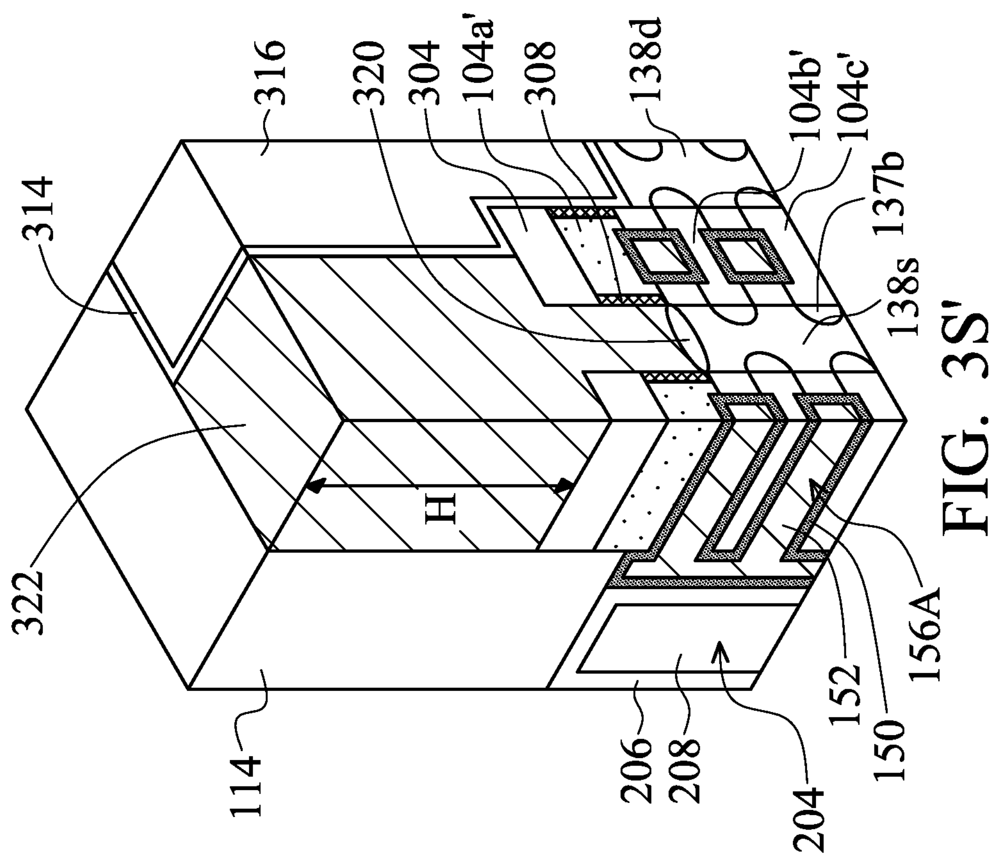
Figure 3S:
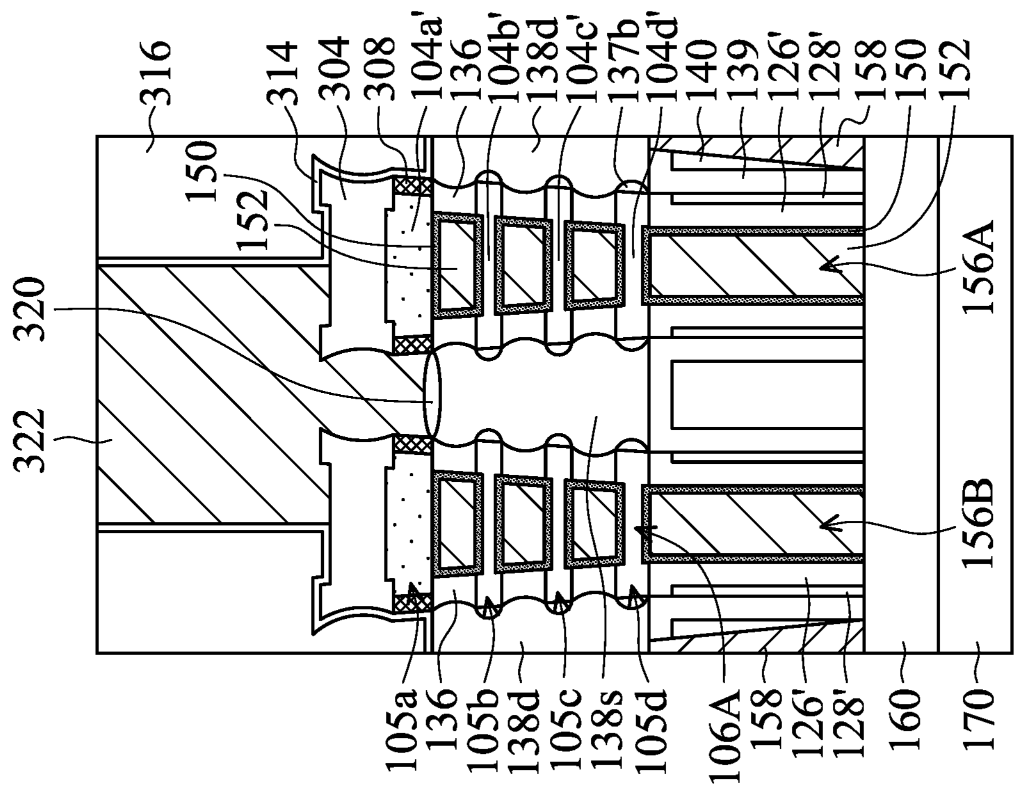

FIG. 3R' is a perspective view illustrating a portion of the structure shown in FIG. 3R, in accordance with some embodiments. As shown in FIGS. 3R and 3R', with the etch stop elements 314, the dielectric fillings 316, and the isolation structure 114 as a self-align etching mask, one or more etching processes are used to remove the remaining semiconductor fin 101A and a portion of the epitaxial structures 138*s*, in accordance with some embodiments. As a result, a backside contact opening 318 that exposes the remaining epitaxial structures 138*s* are formed. In some embodiments, no photolithography process is used for forming the backside contact opening 318. The portion of the backside contact opening 318 extending from the surface of the insulating structure 304 to the epitaxial structure 138*s* has a depth $D_2$, as shown in FIGS. 3R and 3R'. The depth $D_2$ corresponds to the recess depth of the epitaxial structure 138*s*. The depth $D_2$ may be in a range from about 3 nm to about 35 nm.

In some embodiments, the first portion 137*a* of the epitaxial structure 138*s* is completely removed. Due to the protection of the insulating spacers 308, the base structures 104*a*' are prevented from being damaged by the etchant used for forming the backside contact opening 318.

FIG. 3S' is a perspective view illustrating a portion of the structure shown in FIG. 3S, in accordance with some embodiments. FIG. 3S" is a cross-sectional view illustrating a portion of the structure shown in FIGS. 3S and 3S', taken along the longitudinal direction of the metal gate stack 156A or 156B, in accordance with some embodiments. As shown in FIGS. 3S, 3S' and 3S", a backside conductive contact 322 is formed into the backside contact opening 318, in accordance with some embodiments. The backside conductive contact 322 is electrically connected to the epitaxial structure 138*s*. The backside conductive contact 322 may function as a portion of a power rail connected to a source structure such as the epitaxial structure 138*s*.

In some embodiments, before the formation of the backside conductive contact 322, a metal-semiconductor compound layer 320 is formed on the bottom surface of the epitaxial structure 138*s* that is exposed by the backside contact opening 318. The metal-semiconductor compound layer 320 may be a metal silicide material that contains titanium, nickel, cobalt, tantalum, platinum, tungsten, one or more other noble metals, one or more other refractory metals, one or more other rare earth metals, one or more other suitable materials, or a combination thereof. Alternatively, the metal-semiconductor compound layer may be a metal-containing material that contains no silicon. For example, the metal-semiconductor compound layer may contain germanium and a metal element such as titanium, nickel, cobalt, tantalum, platinum, tungsten, one or more other noble metals, one or more other refractory metals, one or more other rare earth metals, one or more other suitable materials, or a combination thereof.

In some embodiments, before the formation of the metal-semiconductor compound layer 320, the exposed epitaxial structure 138*s* is modified to assist in the subsequent formation of the metal-semiconductor compound layer 320. In some embodiments, one or more ion implantation processes are used to reduce the crystallinity of the surface portion of the epitaxial structure 138*s*, which allows a subsequently deposited metal material to react with the modified surface portions more easily. The formation of the metal-semiconductor compound layer 320 may thus be facilitated.

In some embodiments, the implantation process is a plasma doping process. Plasma may be introduced into the backside contact opening 318 to modify the exposed surface portion of the epitaxial structure 138*s*. In some embodiments, reaction gas used in the implantation process includes silicon-containing gas, germanium-containing gas, argon-containing gas, helium-containing gas, one or more other suitable gases, or a combination thereof.

In some embodiments, a metal-containing material is applied (or deposited) on the epitaxial structure 138*s* while the epitaxial structure 138*s* is heated, in accordance with some embodiments. In some embodiments, the metal-containing material is applied (or deposited) using a CVD process, an ALD process, a PVD process, one or more other applicable processes, or a combination thereof. Because the metal-containing material is applied during the heating of the epitaxial structure 138*s*, the thermal energy may help to initiate chemical reaction between the surface portions of the epitaxial structure 138*s* and the metal-containing material. As a result, the surface portions of the epitaxial structure 138*s* react with the metal-containing material, and they are transformed into the metal-semiconductor compound layer 320.

Due to the blocking of the insulating spacers 308, the base structures 104*a*' are prevented from being in contact with the metal-containing material. Therefore, the metal-semiconductor compound layer 320 is prevented from being formed on the base structures 104*a*'. Short circuiting between the base structures 104*a*' and the backside conductive contact 322 is prevented.

As mentioned above, the metal-containing material is applied (or deposited) on the epitaxial structure 138*s* while the epitaxial structure 138*s* is heated. In some embodiments, the epitaxial structure 138*s* is heated to a temperature that is in a range from about 390 degrees C. to about 440 degrees C. In some embodiments, before the metal-containing material is applied (or deposited) on the epitaxial structure 138*s*, the epitaxial structure 138*s* is heated to be at a raised temperature. Afterwards, the epitaxial structure 138*s* is kept at the raised temperature while the metal-containing material is applied (or deposited). The raised temperature may be in a range from about 390 degrees C. to about 440 degrees C.

Many variations and/or modifications can be made to embodiments of the disclosure. In some other embodiments, the metal-containing material is applied (or deposited) on the epitaxial structure 138*s* without heating the epitaxial structure 138*s* at the same time. A subsequent thermal operation is then used to form the metal-semiconductor compound layer 320.

In some embodiments, the metal-containing material is also applied (or deposited) on sidewalls of the backside contact opening 318 and the top surface of the dielectric fillings 316, so as to form a metal layer. Afterwards, an etching process may be used to remove the metal layer that does not react with the epitaxial structure 138*s* and be transformed into the metal-semiconductor compound layer 320.

However, embodiments of the disclosure are not limited thereto. Many variations and/or modifications can be made to embodiments of the disclosure. In some other embodiments, the metal-semiconductor compound layer 320 is not formed.

After the formation of the metal-semiconductor compound layer 320, a conductive material is deposited to overfill the backside contact opening 318, in accordance with some embodiments. The conductive material may be made of or include ruthenium, cobalt, tungsten, titanium, molybdenum, tantalum, nickel, copper, titanium nitride, tantalum nitride, one or more other suitable materials, or a combination thereof. The conductive material may be deposited using an ALD process, a CVD process, a PVD process, an electroplating process, an electroless plating process, one or more other applicable processes, or a combination thereof.

Afterwards, a planarization process is used to remove the conductive material outside of the backside contact opening 318, in accordance with some embodiments. As a result, the remaining portions of the conductive material in the backside contact opening 318 form the backside conductive contact 322. The planarization process mentioned above may include a CMP process, a grinding process, an etching process, a dry polishing process, one or more other applicable processes, or a combination thereof.

Due to the isolation of the insulating spacers 308, no insulating layer needs to be formed along the sidewalls of the backside contact opening 318 to provide electrical isolation between the base structures 104*a*' and the backside conductive contact 322. The filling of the backside conductive contact 322 is thus easy. The quality and reliability of the backside conductive contact 322 are improved.

However, embodiments of the disclosure are not limited thereto. Many variations and/or modifications can be made to embodiments of the disclosure. In some other embodiments, an insulating layer (such as a nitride layer) is deposited along the sidewalls of the backside contact opening 318. The insulating layer may provide further protection to the nearby elements such as the isolation structure during subsequent processes, such as a pre-cleaning operation conducted before the formation of a metal-semiconductor compound layer.

As shown in FIGS. 3S, 3S', and 3S", the backside conductive contact 322 has a first portion that is directly below the base structure 104*a*'. The backside conductive contact 322 also has a second portion that extends upwards to approach the bottom surface of the epitaxial structure 138*s*. Due to the base structures 104*a*' and the insulating structures 304, the metal gate stack 156A or 156B is kept away from the backside conductive contact 322. In some embodiments, the bottommost surface of the metal gate stack 156A or 156B is above the bottommost surface of the base structure 104*a*'.

As shown in FIG. 3S", the metal gate stack 156A or 156B is separated from the backside conductive contact 322 by a distance $D_3$. The distance $D_3$ may be in a range from about 4.5 nm to about 60 nm. The risk of short circuiting between the backside conductive contact 322 and the metal gate stacks 156A and 156B are significantly reduced or prevented.

As shown in FIG. 3S", one of the insulating structures 304 has a thickness $T_1$. The thickness $T_1$ may be in a range from about 5 nm to about 30 nm. One of the base structures 104*a*' has a thickness $T_2$. The thickness $T_2$ may be in a range from about 3 nm to about 30 nm. As shown in FIG. 3S', one of the channel structures (such as the semiconductor nanostructure 104*d*') has a width W. The width W may be in a range from about 6 nm to about 40 nm. As shown in FIG. 3S", the semiconductor nanostructure 104*b*' is laterally separated from one of the dielectric fins 204 by a distance S. The distance S may be controlled by the thickness of the sacrificial spacer 202. The distance S may be in a range from about 5 nm to about 20 nm. As shown in FIG. 3S', the backside conductive contact 322 has a height H measured from a surface of the backside conductive contact 322 to the insulating structure 304. The height H may be in a range from about 10 nm to about 60 nm.

In some embodiments, there are three channel structures (such as the semiconductor nanostructures 104*b*'-104*d*') formed. However, embodiments of the disclosure are not limited thereto. Many variations and/or modifications can be made to embodiments of the disclosure. In some embodiments, the total number of the semiconductor nanostructures is greater than three. In some other embodiments, the total number of the semiconductor nanostructures is smaller than three. The total number of the semiconductor nanostructures (or channel structures) of each semiconductor device structure may be fine-tuned to meet requirements. For example, the total number of the semiconductor nanostructures may be 3 to 8. The semiconductor nanostructures may have many applicable profiles. The semiconductor nanostructures may include nanosheets, nanowires, or other suitable nanostructures.

Embodiments of the disclosure form a semiconductor device structure with a backside conductive contact. A base structure and/or an insulating structure are/is formed between the backside conductive contact and a metal gate stack of the semiconductor device structure. The spacing between the backside conductive contact and the metal gate stack is significantly increased to prevent short circuiting therebetween. An insulating spacer is formed between the base structure and the backside conductive contact. Short circuiting between the backside conductive contact and other conductive elements is thus prevented. The performance and reliability of the semiconductor device structure are thus greatly improved.

In accordance with some embodiments, a semiconductor device structure is provided. The semiconductor device structure includes a stack of channel structures over a base structure. The semiconductor device structure also includes a first epitaxial structure and a second epitaxial structure sandwiching the channel structures. The semiconductor device structure further includes a gate stack wrapped around each of the channel structures and a backside conductive contact connected to the second epitaxial structure. A first portion of the backside conductive contact is directly below the base structure, and a second portion of the backside conductive contact extends upwards to approach a bottom surface of the second epitaxial structure. In addition, the semiconductor device structure includes an insulating spacer between a sidewall of the base structure and the backside conductive contact.

In accordance with some embodiments, a semiconductor device structure is provided. The semiconductor device structure includes a stack of semiconductor nanostructures over a base structure. The semiconductor device structure also includes a first epitaxial structure and a second epitaxial structure sandwiching the semiconductor nanostructures. The semiconductor device structure further includes a gate stack wrapped around the semiconductor nanostructures and a backside conductive contact connected to the second epitaxial structure. A portion of the backside conductive contact is directly below the base structure. In addition, the semiconductor device structure includes an isolation structure adjacent to the backside conductive contact. A topmost surface of the isolation structure is below a topmost surface of the base structure.

In accordance with some embodiments, a method for forming a semiconductor device structure is provided. The method includes forming a fin structure over a semiconductor substrate. The fin structure has multiple first sacrificial layers and multiple semiconductor layers laid out alternately. The fin structure has a base layer below the first sacrificial layers. The method also includes forming an insulating spacer to cover a side surface of the base layer and forming a first epitaxial structure and a second epitaxial structure sandwiching the fin structure. The method further includes removing the first sacrificial layers to release multiple semiconductor nanostructures made of remaining portions of the semiconductor layers. In addition, the method includes forming a gate stack to wrap around each of the semiconductor nanostructures and forming a backside conductive contact electrically connected to the second epitaxial structure. The semiconductor nanostructures are between the backside conductive contact and a topmost surface of the gate stack, and the backside conductive contact is adjacent to the insulating spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a fin structure over a semiconductor substrate, wherein the fin structure has a plurality of sacrificial layers and a plurality of semiconductor layers laid out alternately, and the fin structure has a base layer below the sacrificial layers;

forming an insulating spacer to cover a side surface of the base layer;

forming a first epitaxial structure and a second epitaxial structure sandwiching the fin structure;

removing the sacrificial layers to release a plurality of semiconductor nano structures made of remaining portions of the semiconductor layers;

forming a gate stack to wrap around each of the semiconductor nanostructures; and forming a backside conductive contact electrically connected to the second epitaxial structure, wherein the semiconductor nanostructures are between the backside conductive contact and a topmost surface of the gate stack, and the backside conductive contact is adjacent to the insulating spacer, wherein the first epitaxial structure is wider than the insulating spacer in a direction that extends parallel to a top surface of the semiconductor substrate and perpendicular to a longitudinal direction of the gate stack.

2. The method for forming a semiconductor device structure as claimed in claim 1, further comprising:

recessing the sacrificial layers from side surfaces of the sacrificial layers; and forming inner spacers to cover the side surfaces of the sacrificial layers.

3. The method for forming a semiconductor device structure as claimed in claim 2, further comprising recessing the base layer from the side surface of the base layer before forming the insulating spacer.

4. The method for forming a semiconductor device structure as claimed in claim 3, wherein each of the sacrificial layers has a first atomic concentration of germanium, the base layer has a second atomic concentration of germanium, and the first atomic concentration of germanium is greater than the second atomic concentration of germanium.

5. The method for forming a semiconductor device structure as claimed in claim 4, wherein the fin structure further has a second sacrificial layer below the base layer, the second sacrificial layer is removed to form a through hole during the recessing of the sacrificial layers from the side surface of the sacrificial layers, and the method further comprises:

forming an insulating structure to at least partially fill the through hole.

6. The method for forming a semiconductor device structure as claimed in claim 5, wherein the second sacrificial layer has a third atomic concentration of germanium, and the third atomic concentration of germanium is greater than the first atomic concentration of germanium.

7. The method for forming a semiconductor device structure as claimed in claim 5, wherein the recessing of the sacrificial layers and the formation of the through hole are performed simultaneously.

8. The method for forming a semiconductor device structure as claimed in claim 7, wherein the formation of the inner spacers and the formation of the insulating structure are performed simultaneously.

9. The method for forming a semiconductor device structure as claimed in claim 8, wherein the inner spacers and the insulating structure are formed from a same insulating layer.

10. The method for forming a semiconductor device structure as claimed in claim 1, further comprising:

forming a sacrificial spacer along a top and sidewalls of the fin structure; and forming a dielectric fin adjacent to the sacrificial spacer before the first epitaxial structure and the second epitaxial structure are formed.

11. A method for forming a semiconductor device structure, comprising:

forming a fin structure over a semiconductor substrate, wherein the fin structure has a plurality of sacrificial layers and a plurality of semiconductor layers laid out alternately, and the fin structure has a base layer below the sacrificial layers;

recessing the base layer;

forming an insulating spacer to completely cover an exposed side surface of the base layer after the recessing of the base layer;

removing the sacrificial layers to release a plurality of semiconductor nanostructures made of remaining portions of the semiconductor layers; and forming a gate stack wrapped around each of the semiconductor nanostructures.

12. The method for forming a semiconductor device structure as claimed in claim 11, further comprising:

recessing the sacrificial layers;

forming inner spacers covering side surfaces of the sacrificial layers after the recessing of the sacrificial layers; and forming an epitaxial structure adjacent to the inner spacers and the semiconductor layers.

13. The method for forming a semiconductor device structure as claimed in claim 12, wherein the insulating spacer is formed after the inner spacers are formed.

14. The method for forming a semiconductor device structure as claimed in claim 13, further comprising:

forming a backside conductive contact electrically connected to the epitaxial structure, wherein the semiconductor nanostructures are between the backside conductive contact and a topmost surface of the gate stack.

15. The method for forming a semiconductor device structure as claimed in claim 14, further comprising:

forming a metal-semiconductor compound layer directly on a bottom of the epitaxial structure, wherein the metal-semiconductor compound layer is between the epitaxial structure and the backside conductive contact.

16. A method for forming a semiconductor device structure, comprising:

forming a fin structure over a semiconductor substrate, wherein the fin structure has a plurality of sacrificial layers and a plurality of semiconductor layers laid out alternately, the fin structure has a base layer below the sacrificial layers, and the fin structure further has a second sacrificial layer below the base layer;

removing the second sacrificial layer to form a through hole between the fin structure and the semiconductor substrate;

forming an insulating structure to at least partially fill the through hole;

removing the sacrificial layers to release a plurality of semiconductor nanostructures made of remaining portions of the semiconductor layers; and forming a gate stack wrapped around each of the semiconductor nanostructures.

17. The method for forming a semiconductor device structure as claimed in claim 16, further comprising:

recessing the sacrificial layers;

forming inner spacers covering side surfaces of the sacrificial layers after the recessing of the sacrificial layers; and forming an epitaxial structure adjacent to the inner spacers and the semiconductor layers of the fin structure.

18. The method for forming a semiconductor device structure as claimed in claim 17, wherein the recessing of the sacrificial layers and the removal of the second sacrificial layers are performed simultaneously, and the inner spacers and the insulating structure are formed from a same insulating layer.

19. The method for forming a semiconductor device structure as claimed in claim 17, further comprising:

at least partially removing the semiconductor substrate to expose a bottom of the epitaxial structure and the insulating structure; and forming a backside conductive contact adjacent to the insulating structure and the bottom of the epitaxial structure.

20. The method for forming a semiconductor device structure as claimed in claim 16, further comprising:

forming a sacrificial spacer along a top and sidewalls of the fin structure;

forming a dielectric fin adjacent to the sacrificial spacer; and removing the sacrificial spacer while the sacrificial layers are removed.

* * * * *